(12) United States Patent
Farnsworth et al.

(10) Patent No.: US 6,708,305 B1
(45) Date of Patent: Mar. 16, 2004

(54) DETERMINISTIC RANDOM LBIST

(75) Inventors: L. Owen Farnsworth, Lincoln, VT (US); Brion L. Keller, Conklin, NY (US); Bernd K. Koenemann, San Jose, CA (US); Timothy J. Koprowski, Newburgh, NY (US); Thomas J. Snethen, Endwell, NY (US); Donald L. Wheater, Hinesburg, VT (US)

(73) Assignee: International Business Machines Corporation, Armonk, NY (US)

( * ) Notice: Subject to any disclaimer, the term of this patent is extended or adjusted under 35 U.S.C. 154(b) by 504 days.

(21) Appl. No.: 09/691,370

(22) Filed: Oct. 18, 2000

(51) Int. Cl.[7] ............................................. G01R 31/28
(52) U.S. Cl. ........................................ 714/739; 714/728
(58) Field of Search ........................ 714/724, 726, 714/739, 728, 738

(56) References Cited

U.S. PATENT DOCUMENTS

| | | | |
|---|---|---|---|
| 5,173,906 A | 12/1992 | Dreibelbis et al. | |
| 5,361,264 A | 11/1994 | Lewis | |
| 5,369,648 A | 11/1994 | Nelson | |
| 5,479,414 A | 12/1995 | Keller et al. | |
| 5,546,406 A | 8/1996 | Gillenwater et al. | |
| 5,640,402 A * | 6/1997 | Motika et al. | 714/731 |
| 5,668,816 A * | 9/1997 | Douskey et al. | 714/720 |
| 5,680,543 A | 10/1997 | Bhawmik | |
| 5,701,308 A | 12/1997 | Attaway et al. | |
| 5,783,960 A * | 7/1998 | Lackey | 327/295 |
| 5,805,789 A | 9/1998 | Huott et al. | |
| 5,825,785 A * | 10/1998 | Barry et al. | 714/732 |
| 5,912,901 A | 6/1999 | Adams et al. | |
| 5,918,003 A | 6/1999 | Koch et al. | |
| 5,925,144 A | 7/1999 | Sebaa | |
| 5,983,380 A | 11/1999 | Motika et al. | |
| 6,021,514 A * | 2/2000 | Koprowski | 714/733 |
| 6,178,534 B1 * | 1/2001 | Day et al. | 714/745 |
| 6,314,540 B1 * | 11/2001 | Huott et al. | 714/738 |
| 6,327,685 B1 * | 12/2001 | Koprowski et al. | 714/733 |
| 6,393,594 B1 * | 5/2002 | Anderson et al. | 714/738 |
| 6,438,722 B1 * | 8/2002 | Bailey et al. | 714/736 |
| 6,442,720 B1 * | 8/2002 | Koprowski et al. | 714/726 |
| 6,453,436 B1 * | 9/2002 | Rizzolo et al. | 714/726 |

* cited by examiner

*Primary Examiner*—Albert Decady
*Assistant Examiner*—Miytaba Chaudry
(74) *Attorney, Agent, or Firm*—Schmeiser, Olsen & Watts; Robert A. Walsh

(57) ABSTRACT

Deterministic random Logic Built In Self Test (LBIST) is disclosed that applies Deterministic Stored Pattern Tests (DSPTs) by using random LBIST. Basically, the present invention selects the appropriate pseudorandom pattern for use with a scan cycle that needs care bits. The scan cycle may be a current or future scan cycle. In particular, the present invention determines care bits for a particular scan cycle. A pseudorandom pattern is generated that is then aligned with the particular scan cycle. If the pseudorandom pattern contains the care bits, with the correct values and in the proper positions within the pattern, this alignment tests one or more logic devices.

20 Claims, 15 Drawing Sheets

DETERMINISTIC RANDOM LBIST

BACKGROUND OF THE INVENTION

1. Technical Field

This invention relates to the field of testing semiconductor circuits. More specifically, the invention relates to deterministic random Logic Built In Self Test (LBIST).

2. Background Art

Computer chips have become extremely complex: Millions of logic devices can be made to fit on one chip. Because of this complexity, it is essential that these chips be tested. Thus, as part of the millions of devices that can make up a semiconductor chip, there are devices added directly to the chip to help with testing. These devices perform an internal type of testing, which tests the inner workings of the chip. Generally, an external testing device can read the results of these tests to determine if the chip has any errors in its circuitry.

One popular testing method in this vein is called Logic Built In Self Test (LBIST). One way of performing LBIST is to have a pseudorandom pattern generator generate a variety of pseudorandom patterns that can be used to test logic devices. This testing methodology is often called random LBIST.

Theoretically, a chip could be tested by inputting, to the various logic devices on the chip, every possible input combination. Every output created by these inputs would then be viewed to determine if the correct output was captured. This would be perfect fault coverage. However, an exhaustive test involves such an extensive number of test patterns that it is expensive to apply. Early when there are many faults that are untested, random LBIST is relatively productive. However, as fault coverage climbs and fewer untested faults remain, random LBIST begins generating a high ratio of unproductive tests. The fault coverage obtainable with random LBIST typically tails off and stalls before the fault coverage is reached that is needed to ensure desired product quality. Consequently, many of the difficult faults are left untested by random LBIST. This problem has precluded random LBIST from obtaining the desired fault coverage and test quality level within a reasonable number of test patterns. So, while random LBIST is effective in testing many faults, it is not a complete test.

A cost-effective approach to this problem is to simulate a representative model of possible faults in the device and determine which inputs or care bits are required to test each of these faults. Tests are generated that provide these required inputs, and the corresponding faults may then be marked as being covered. Historically, deterministic stored pattern testing has avoided the problems of random LBIST by determining these required inputs and using the inputs to test the computer chip. Deterministic stored pattern testing entails analyzing the logic devices on the computer chip and determining the inputs that would test particular faults. For example, to adequately test a three-input NAND gate, all eight combinations of inputs would need to be tested. To test a "stuck at one" fault, however, only one of these combinations—setting all three inputs to ones or a high voltage—need be input to the NAND gate. When all three inputs are a high voltage, the output of the NAND gate should change from a one to a zero. If the output stays a one (a high voltage), the NAND gate is not functioning properly. Deterministic stored pattern testing attempts to find and test these types of particular errors.

To perform deterministic stored pattern testing, the precalculated, stored deterministic patterns are downloaded from the tester into the chip. These deterministic patterns contain the important bits to test particular faults, and they contain these important bits in the correct positions. For instance, to test a stuck at one fault for a three-input NAND gate, the tester needs to download the three important, high bits at the correct locations. These important bits are known as care bits. Generally, logic devices on the computer chip are organized into "scan channels" that allow information to be moved through the logic devices. Each scan channel is a series of logic latches. The tester must download the care bits into the scan channels so that the bits are correctly positioned in the scan channels to adequately test the particular fault.

Deterministic testing is very beneficial, as it discovers faults that LBIST simply will not discover with a reasonable number of tests. A problem with deterministic testing, however, is that the scan bits must be written onto the chip and the results must be read off of the chip. Unlike in LBIST, where both test bits and result bits are generated on chip, all of the test bits for deterministic testing are generated off chip and the result bits are communicated off chip. The number of test bits can be very large, and the number of result bits can be quite high. Downloading the test bits and reading the result bits take a tremendous amount of bandwidth and can be time consuming.

What is needed is a way of performing deterministic testing without the high bandwidth required by off chip deterministic testing, yet also still retaining the benefits of random LBIST.

DISCLOSURE OF INVENTION

To overcome these problems, deterministic random Logic Built In Self Test (LBIST) is disclosed that applies Deterministic Stored Pattern Tests (DSPTs) by using random LBIST. Basically, the present invention selects the appropriate pseudorandom pattern for use with a scan cycle that needs care bits. The scan cycle may be a current or future scan cycle. In particular, the present invention determines care bits for a particular scan cycle. A pseudorandom pattern is generated that is then aligned with the particular scan cycle. If the pseudorandom pattern contains the care bits, with the correct values and in the proper positions within the pattern, this alignment properly tests one or more logic devices.

There are various techniques used to align a pseudorandom pattern, which contains the correct values in the correct positions for the care bits, with the scan cycle to ensure that a logic device is properly tested. For instance, pseudorandom patterns may be skipped until the pseudorandom pattern is found that has the correct care bits for the current scan cycle. Alternatively, care bits for a future scan cycle may determined and if a current or intermediate pseudorandom pattern contains the correct care bits for the future scan cycle, the current pseudorandom pattern may be output until and through the future scan cycle. This can be done by starting at the current scan cycle and "looking forward" to the future scan cycle or by starting at the future scan cycle and "looking backward" to the current scan cycle. Additionally, care bits for a future scan cycle may determined and a pseudorandom pattern generator (PRPG) perturbed, preferably through the use of an input bit, to force the pseudorandom pattern, at the future scan cycle, to contain the appropriate care bits in the appropriate positions. Also, the care bit requirements of multiple scan cycles in the future can be evaluated in determining how a PRPG can be perturbed.

The present invention takes into account that most scan bits are "don't care" bits. The don't care bits can be assigned either a zero or a one state, without loss of quality, in the course of manipulating a pseudorandom pattern generator or channel controls when delivering the required care bits.

Because the on chip pseudorandom pattern generators are being used to create the pseudorandom patterns, the high bandwidth cost of a DSPT are reduced or eliminated. The DSPT equipment may be used in a slightly different manner than for normal DSPT, and the computer chip has to have one or more clock gates that help to align the pseudorandom patterns with the appropriate scan cycles. The improvements result in much lower test times for very little increased costs.

The foregoing and other features and advantages of the present invention will be apparent from the following more particular description of preferred embodiments of the invention, as illustrated in the accompanying drawings.

BRIEF DESCRIPTION OF DRAWINGS

Preferred embodiments of the present invention will hereinafter be described in conjunction with the appended drawings, where like designations denote like elements, and:

FIGS. 5, 8, 10, 13, 16, and 19 are tables of care bits for the scan channels of FIG. 3;

FIG. 6 is a table of exemplary pseudorandom patterns for a number of scan cycles;

FIG. 9 is a table of exemplary pseudorandom patterns and scan gates, for a number of scan cycles, produced by the circuit of FIG. 3 in accordance with a preferred embodiment of the present invention;

FIG. 11 is a table of exemplary pseudorandom patterns for a number of scan cycles;

FIG. 14 is a table of exemplary pseudorandom patterns and scan gates, for a number of scan cycles, produced by the circuit of FIG. 3 in accordance with a preferred embodiment of the present invention;

FIG. 17 is a table of exemplary pseudorandom patterns and scan gates, for a number of scan cycles, produced by the circuit of FIG. 3 in accordance with a preferred embodiment of the present invention;

FIG. 20 is a table of exemplary pseudorandom patterns and scan gates, for a number of scan cycles, produced by a SISR in accordance with a preferred embodiment of the present invention;

BEST MODE(S) FOR CARRYING OUT THE INVENTION

Figure 1:
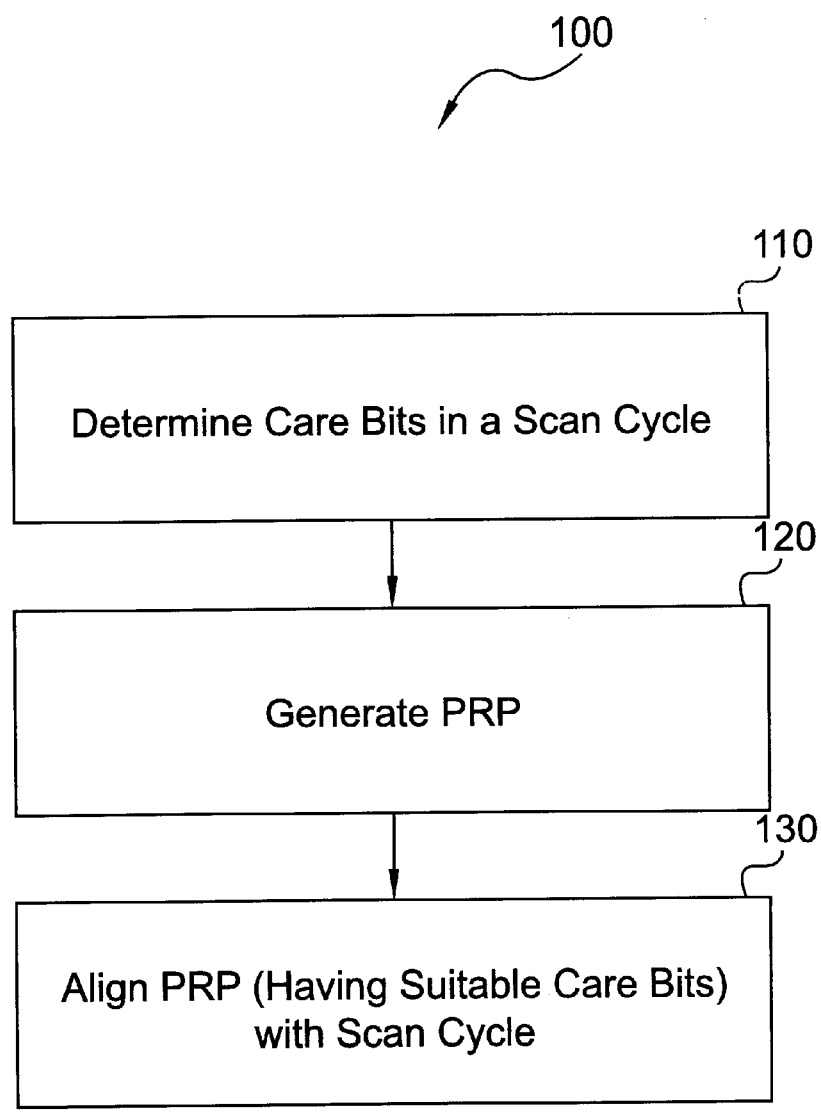
FIG. 1 is a method for deterministic random Logic Built In Self Test (LBIST) in accordance with a preferred embodiment of the present invention.

To overcome the problems of the prior art, deterministic random Logic Built In Self Test (LBIST) is disclosed that applies Deterministic Stored Pattern Tests (DSPTs) by using random LBIST. Basically, the present invention selects the appropriate pseudorandom pattern for use with a scan cycle that needs care bits. The scan cycle may be a current or future scan cycle. In particular, the present invention determines care bits for a particular scan cycle. A pseudorandom pattern is generated that is then aligned with the particular scan cycle. If the pseudorandom pattern contains the care scan cycle, with the correct values and at the proper scan channel inputs, this alignment properly establishes these care bits required for a test of one or more logic devices.

The present invention takes into account that most scan bits are "don't care" bits. The don't care bits can be assigned either a zero or a one state, without loss of quality, in the course of manipulating a pseudorandom pattern generator or channel controls when delivering the required care bits.

There are various techniques used to align a pseudorandom pattern, which contains the correct values in the correct positions for the care bits, with a scan cycle to ensure that a logic device is properly tested. For instance, pseudorandom patterns may be skipped until the pseudorandom pattern is found that has the correct care bits for the current scan cycle. The preferred manner of skipping the pseudorandom pattern is stopping the shifting of the scan channels and the Multiple Input Signature Registers (MISRs). This allows a PRPG (pseudorandom pattern generator) to generate new pseudorandom patterns while the new patterns are not applied to the scan channels.

Alternatively, care bits for a future scan cycle may determined and if a current pseudorandom pattern contains the correct care bits for the future scan cycle, the current pseudorandom pattern may be output until and through the future scan cycle. Moreover, this can be done by starting at the current scan cycle and "looking forward" to the future scan cycle or by starting at the future scan cycle and "looking backward" to the current scan cycle. For this embodiment, the PRPG may be stopped while the scan channels and MISR are shifted. This allows data to still be scanned into the scan channels and a result to be formed within the MISR. In this embodiment, the PRPG may also be left to advance and the scan channels and MISR stopped from shifting. This allows a PRPG (pseudorandom pattern generator) to generate new pseudorandom patterns while the new patterns are not applied to the scan channels.

Additionally, care bits for a future scan cycle may determined and a pseudorandom pattern generator perturbed, preferably through the use of an input bit, to force the pseudorandom pattern at the future scan cycle to contain the appropriate care bits in the appropriate positions. In this embodiment, a PRPG most preferably has an input that changes the output and the seed. The seed is the starting state for the PRPG. Also, the care bit requirements of multiple scan cycles in the future can be evaluated in determining how a PRPG can be perturbed.

In the most preferred embodiments of the present invention, a PRPG is connected to a number of scan channels, at the "beginning" of the scan channels. Each scan channel contains many serial devices that allow data to be serially scanned in and out. The outputs of the serial devices are connected to the inputs of the logic devices under test, and the outputs of the logic devices are connected to inputs of the serial devices. The outputs of the logic devices are read out through the scan channel. Most preferably, a MISR is connected to the "ends" of the scan channels. This way, the MISR creates a signature that is a mathematical combination of the inputs from the scan channel. An external DSPT controller reads the output of the MISR to ascertain whether the logic under test performed as expected. While the MISR is not necessary, it limits the amount of data transferred off chip.

Because the on chip pseudorandom pattern generators are being used to create the pseudorandom patterns, the high bandwidth cost of a DSPT is reduced or eliminated.

Moreover, because the deterministic test patterns are generated on a computer chip under test, the DSPT generally does not need to store the test patterns. This saves memory. The DSPT equipment may be used in a slightly different manner than for normal DSPT, and the computer chip has to have one or more clock gates that help to align the pseudorandom patterns with the appropriate scan cycles. The improvements result in much lower test times for very little increased costs.

It is beneficial at this point to discuss some terminology. A "random pattern" means any random pattern produced by any type of random pattern generator. Generally, such patterns will be "pseudo"-random, meaning that the random pattern generator produces patterns that appear to be random but that are predictable and can be simulated. A "pseudorandom pattern generator" is any device that can produce pseudorandom patterns. Such devices could be a PRPG, a Single Input Signature Register (SISR), a MISR, or any other device that can produce a pseudorandom pattern. Such devices usually have some type of linear feedback system and a shift register. The differences between a MISR, SISR, and PRPG are really whether there is any input or not and how many inputs there are. In the case of a PRPG, these devices take a seed and then it is a closed loop—there is no data coming in from the outside. In the case of a SISR, these devices take a seed and provide a single input coming in from the outside. In the case of a MISR, these devices take a seed and provide multiple inputs coming in from the outside. Fundamentally, these devices all operate the same: each of them is a shift register with feedbacks going to XOR gates.

"Appropriate care bits" or "appropriate care bit" or "appropriate at least one care bit" will mean that the scan bits and scan channels contain the care bit or bits at the correct locations and at the correct values in order to test one or more logic devices.

It is also at this point beneficial to discuss how testing of a computer chip is performed. The DSPT controller determines when the data is clocked into and out of the scan channels and when the logic devices are tested. The DSPT is a tester. As such, it generally does not do a test generation or simulation of a computer chip's logic or embedded test devices (such as PRPGs, channels, etc.). This simulation will have been done previously off line by a test generation or simulation software application. The output from that application will describe when and with what data the PRPGs, MISRs, etc., are initialized, and it gives the data stream for controlling the scan gate signals, the SISR inputs, and the instructions for when the MISRs are to be observed and reset. The DSPT controller receives only an instruction set which it executes. All the simulation, inputs/controls applied to the computer chip and outputs observed from the product are predetermined by the test generation software. There is often another piece of software, the test data supply, that converts the tester platform-generic file created by test generation software into a tester-specific instruction set.

Figure 2:
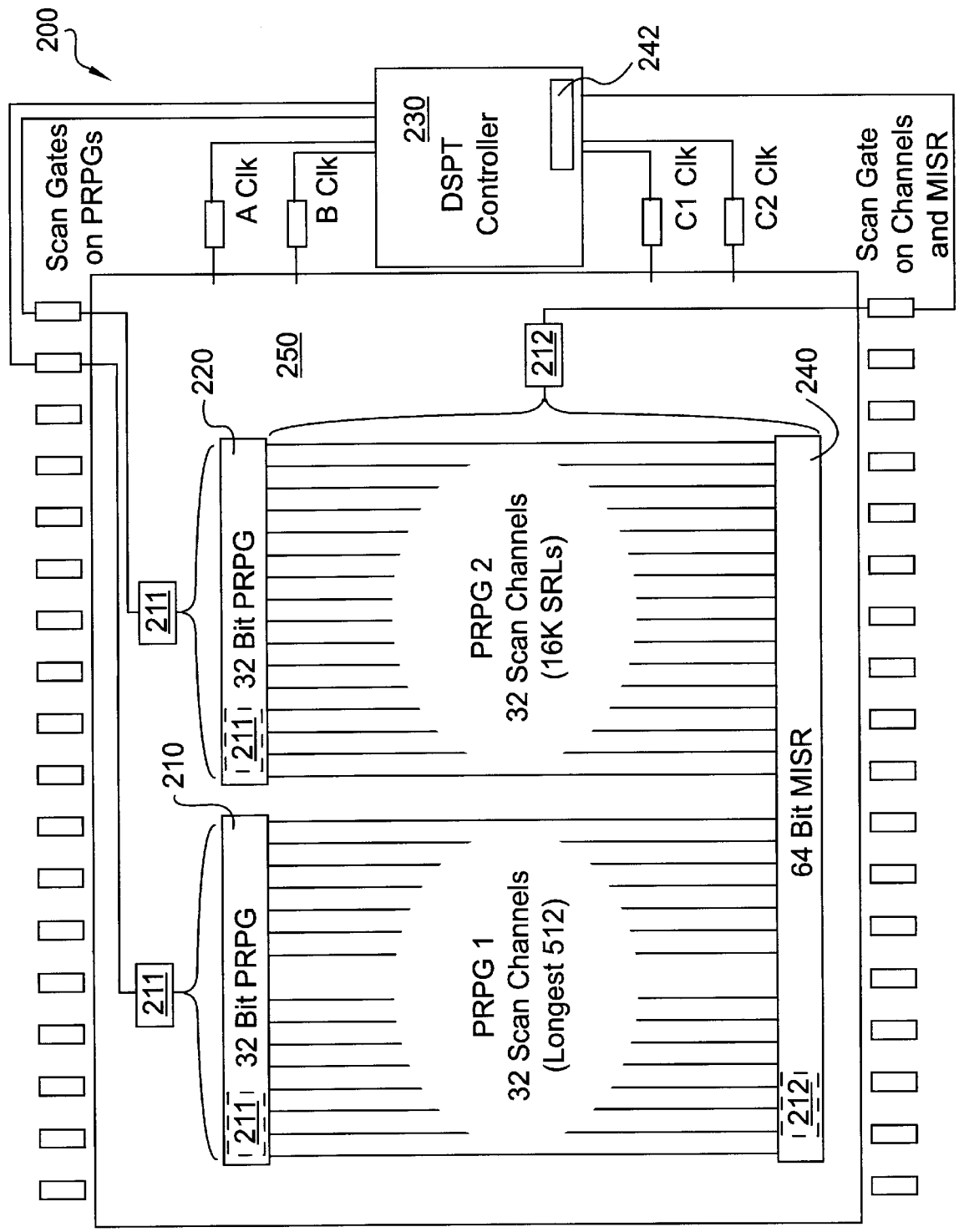
FIGS. 2 and 3 are systems for testing a chip in accordance with preferred embodiments of the present invention.

Turning now to FIGS. 1 and 2, in FIG. 1 a method 100 for preforming deterministic random LBIST is shown, and FIG. 2 shows a system 200 for testing a chip 250 in accordance with the method 100. Method 100 is used to test computer chips 250 that have pseudorandom pattern generators. The computer chips are placed into a tester that supports DSPT.

In FIG. 2, there is a computer chip 250 that communicates with a DSPT controller 230. DSPT controller 230 comprises an instruction set 242. Instruction set 242 can contain the current scan channel bits, if necessary, and any instructions that will be executed. The computer chip 250 comprises a number of pads (not labeled) to which the DSPT controller would be connected. Computer chip 250 also comprises two 32 bit PRPGs 210, 220 that are connected to 32 scan channels, for a total of 64 scan channels. Each scan channel is connected to a 64 bit MISR 240.

The DSPT controller controls the A, B, C1, and C2 clocks. Additionally, it also controls the PRPG scan gate signals (called P scan gate signals herein) and a scan gate signal for the MISR and scan channels, called an M scan gate signal herein. The A and B clocks are scan clocks, components of Level Sensitive Scan Design (LSSD). The A and B clocks are pulsed sequentially to move data forward one latch in a scan channel. To load a scan channel of length eight requires eight pairs of A/B pulses to shift new values down the length of the channel. Each A/B pulse pair also advances the PRPGs 210 and 220 one state which generates a new logic state for the input end of the scan channel. While the scan channel is being loaded, it is simultaneously being unloaded. These very same eight A/B pulse pairs move eight logic values down out of the scan channel and into the MISR 240. With each of these A/B pairs, the MISR 240 is advanced one cycle, compressing the incoming logic state into the signature being built within the MISR 240. Thus, each "channel scan" loads both care and don't care bits for the upcoming test while simultaneously unloading and compressing the prior test's result bits into the MISR.

The C1 and C2 clocks used in the example are the clocks used to apply the test to the device logic. The test of the logic device usually occurs between each channel scan. While this and additional examples herein discuss LSSD clocks, the current invention can be used with any scan clocking design that uses random LBIST.

Each P scan gate is a signal that will gate off the clocks for its associated PRPG. For instance, the P scan gate signal for PRPG 210 will gate off the A and B clocks (and any other clock that needs to be gated off) to ensure that the PRPG does not advance. The P scan gate signal for PRPG 220 will gate off the A and B clocks (and any other clock that needs to be gated off) to ensure that the PRPG does not advance. By "gate" it is meant that the clock to the PRPG will not cause the PRPG to advance cycles, which generally means that the clock does not transition.

Each of the P and M scan gate signals will be routed to a device that actually gates off the appropriate clock or clocks. For example, the 32 bit PRPGs 210 and 220 each could contain a clock gating device 211 that would gate clocks that cause the PRPGs to advance. Alternatively, the clock trees between the PRPG and the off-chip pads could contain the clock gating device 211, as is also shown in FIG. 2. Similarly, the MISR and SRLs (or other scannable devices) could contain a clock gating device 212 that stops the appropriate clocks from advancing the MISR or SRLs. Alternatively, and more likely due to requiring less chip area, the clock trees to the MISR and SRLs would contain the clock gating devices 212.

One device (such as clock gating devices 211 and 212) for gating a clock is a two input OR gate, where the P scan gate signal is one input and the A clock (for example) is the other input, and the output is a clock that advances the PRPG. When the P scan gate signal is a low value, the A clock freely passes through the OR gate; when the P scan gate signal is a high value, the output of the OR gate is a high value, regardless of the state of the A clock. The gates controlling the individual PRPGs would preferably gate that portion of the scan clock tree(s) that is (are) connected to the given PRPG. The scan channel gate and MISR gate, called the M scan gate signal herein, would preferably gate that portion of the scan clock tree(s) that is (are) connected to the scan channels. Gating off the scan channels stops data from moving through the scan channels, while gating off the MISR stops the MISR from accepting new inputs and updating its result.

In an LSSD design, as given in the examples herein, in each case different portions of the A clock tree would have to be gated. For completeness, a designer would likely also gate the corresponding portions of the B clock trees. More generally, to encompass other scan designs, gating the various testing devices entails gating that portion of the scan clock tree or trees that control the device being gated.

Method 100 of FIG. 1 is used by DSPT controller 230 to test chip 250 in a deterministic manner. The DSPT controller 230 will be executing instructions that cause he DSPT controller to control the PRPGs 210, 220, the scan channels, the MISR 240, and the logic devices (not shown). Method 100 starts when care bits in a scan cycle are determined (step 110). As is known in the art, care bits are those bits that are used to test particular logic devices and states of those devices. This will be shown in more detail below. It should be noted that the steps in method 100 (and other methods herein) are not necessarily in order. The scan cycle having the care bits can be a current scan cycle or a future scan cycle, or multiple scan cycles can be considered together, including the current scan cycle and/or future scan cycles.

In step 120, a pseudorandom pattern is generated. If the pseudorandom pattern has the suitable care bits for the care bits determined in step 110, the pseudorandom pattern is aligned with the scan cycle determined in step 110. Suitable care bits will be the correct values of care bits in the correct position or positions within the scan channels. If the current pseudorandom pattern does not have suitable care bits for the current or future scan cycle, the pseudorandom pattern may be skipped and new pseudorandom patterns generated until a pseudorandom pattern is found that has suitable care bits. Alternatively, care bits for a future scan cycle may be determined and if a current pseudorandom pattern contains the correct care bits for the future scan cycle, the current pseudorandom pattern may be output until and through the future scan cycle. Moreover, this can be done by starting at the current scan cycle and "looking forward" to the future scan cycle or by starting at the future scan cycle and "looking backward" to the current scan cycle. Moreover, a pseudorandom pattern generator may be perturbed during the current scan cycle to ensure that the future scan cycle contains the suitable care bits. These concepts will be discussed in more detail in reference to upcoming figures.

Method 100 takes into account that most scan bits are don't care bits. The don't care bits can be assigned either a zero or a one state, in the course of manipulating a pseudorandom pattern generator or channel controls, when delivering the required care bits.

Thus, method 100 provides a way of using the output pseudorandom patterns created by pseudorandom pattern generators to test logic devices with deterministic patterns.

Figure 3:
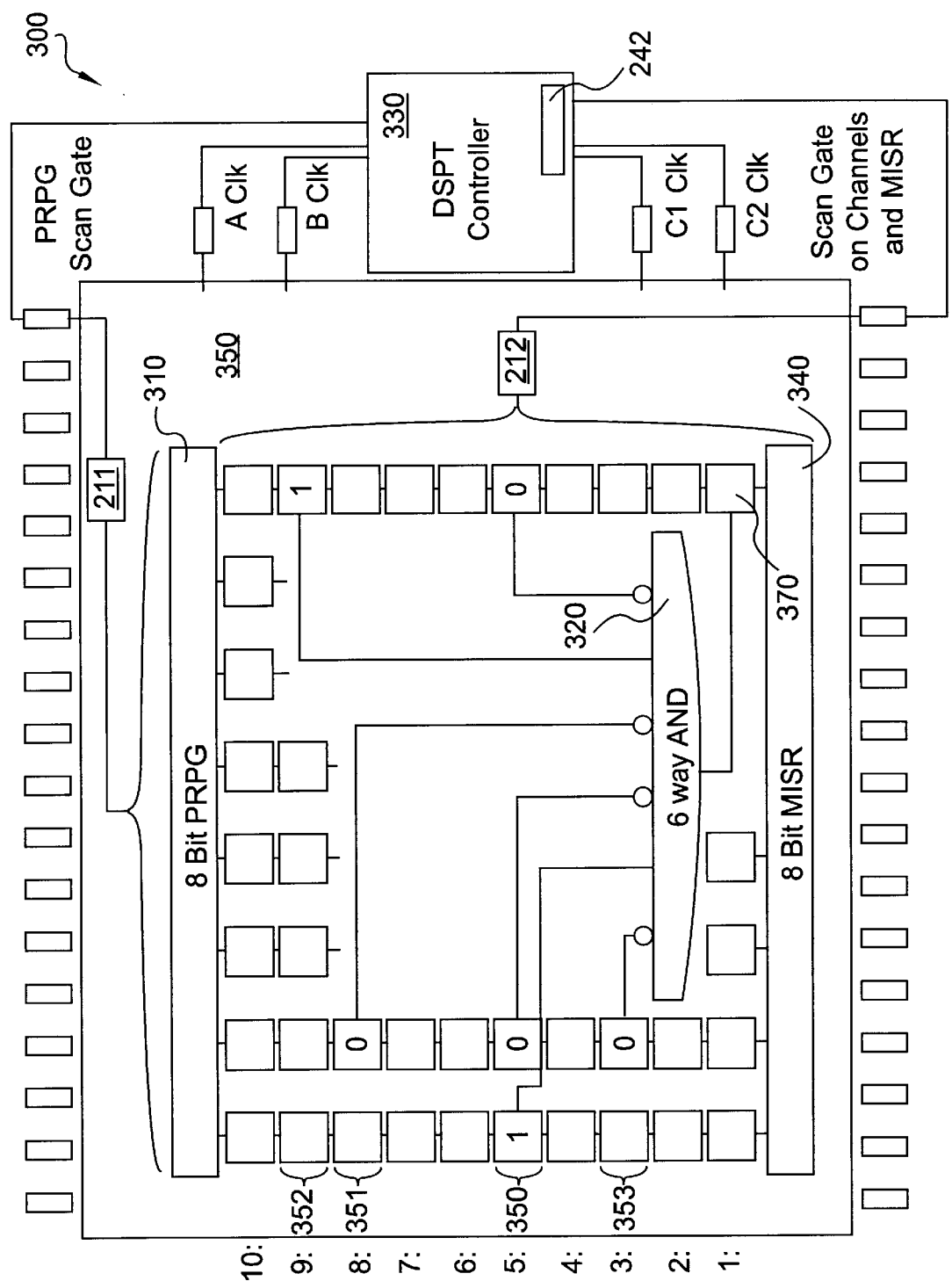

Referring now to FIG. 3, a system 300 for testing computer chips is shown. System 300 comprises DSPT controller 330, which has already been discussed, and chip 350. Chip 350 comprises eight bit PRPG 310, a six way AND gate 320, a PRPG scan gate signal (called the P scan gate signal herein), a scan gate signal on the scan channels and MISR 340 (called an M scan gate signal herein), an eight bit MISR 340, a clock gating device 211 and a clock gating device 212. The clock gating devices 211 and 212 gate the clock(s) that cause the PRPG 310 to cycle and the clocks(s) that cause the scan channels and the MISR 340 to cycle, respectively. Any device that allows a logic device to be gated when a signal is active is suitable for use as clock gating devices 211 and 212. There are eight scan channels that are connected to the PRPG 310 and the MISR 340. Each scan channel has 10 bits, of which only some are shown. It takes 10 scan cycles to load data into and out of each scan channel. Each location in a scan channel is an input or an output. For instance, scan bit 370 is the output of 6 way AND gate 320. As is known in the art, each scan location will contain a way to input data from the scan channel and to output data to the scan channel. The bits in each scan channel may be thought of as a scan vector.

To suitably test a logic device, the rows and columns of the scan channels must contain bits that are at the correct value and in the correct location. For example, to test a stuck at one condition for the exemplary AND gate 320 the following must occur: row 353 must have the zero in the second scan channel (for a row of x0xxxxxx, where an "x" is a don't care); row 350 must have the one and two zeros in the first, second, and eighth scan channels (for a row of 10xxxxx0); row 351 must have the zero in the second scan channel (for a row of x0xxxxxx); and row 352 must have the one in the eighth scan channel (for a row of xxxxxxx1). Moreover, all of these six bits must exist at these locations in the same scan cycle and prior to the time when the six way AND is tested (if the AND is clocked). It should be noted that the row and column format of FIG. 3 is only exemplary, and scan channels on many computer chips can be much more complicated.

By "scan cycle" it is meant that data will be serially advanced through the scan channels during a scan cycle. A scan cycle causes the scan bits to move through the scan channels. The DSPT controller causes the P scan gate signal to gate the clocks to the PRPG when necessary. When the P scan gate signal is active, the clocks are gated to the PRPG such that the PRPG does not advance. It will produce the same pseudorandom pattern output. Additionally, the DSPT controller causes the M scan gate signal to gate the clocks to the MISR and the scan channels when necessary. When the M scan gate signal is active, the clocks are gated to the MISR and the scan channels such that the MISR and scan channels do not advance. The MISR will not read any input values and the scan gate signals will not serially transfer any data.

Figure 7:
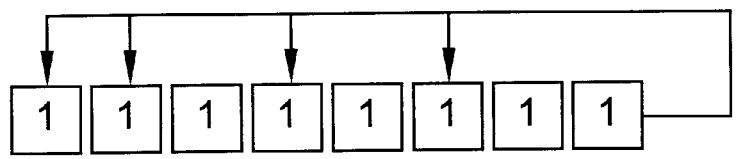
FIG. 7 is a block diagram of the pseudorandom pattern and feedback for the 8-bit pseudorandom pattern generator of FIG. 3.
Figures 5, 6:
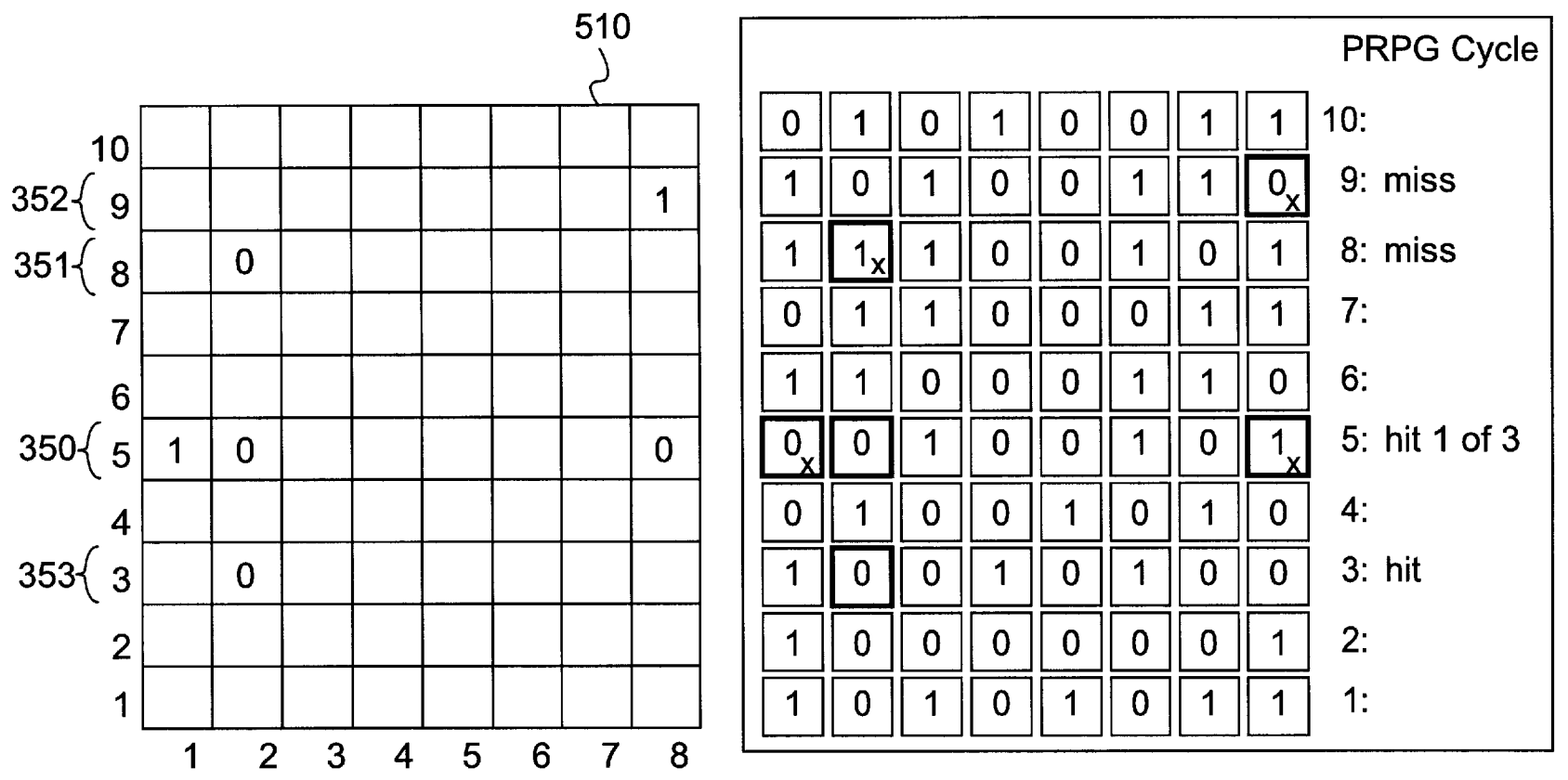

Turning to FIGS. 5, 6 and 7 in addition to FIG. 2, FIG. 5 shows the care bits, for a particular scan cycle, that are needed to test a stuck at one fault for six way AND gate 320. The bits in the table are the care bits in the correct row and column locations that they would need to be in to test AND gate 320. The other bits are don't care bits. FIG. 7 shows the seed and feedback for the PRPG 310. FIG. 6 shows exemplary PRPG cycles for PRPG 340 if the PRPG were left to generate pseudorandom patterns. The care bit positions are bold.

FIG. 6 shows the problem of testing the stuck at one fault with this particular AND gate 320. If the chances of generating ones and zeros are equal, the chance of the PRPG accidentally generating the required care bits are about 1 in 64. For the set of scan bits in FIG. 6, the PRPG bits missed 4 of the 6 bits required to test the stuck at one fault. Thus, random LBIST for this particular fault would be relatively hard to test in a limited time period.

To overcome this effect, one aspect of the present invention uses current pseudorandom patterns and compares these with the needed care bits for the current scan cycle. If there are no needed care bits for the current cycle, the pseudorandom pattern is output. If there are needed care bits for the current cycle, a pseudorandom pattern is aligned with the current cycle by generating pseudorandom patterns until a suitable pseudorandom pattern is found, having the correct bits in the correct locations, and this is output.

Figure 4:
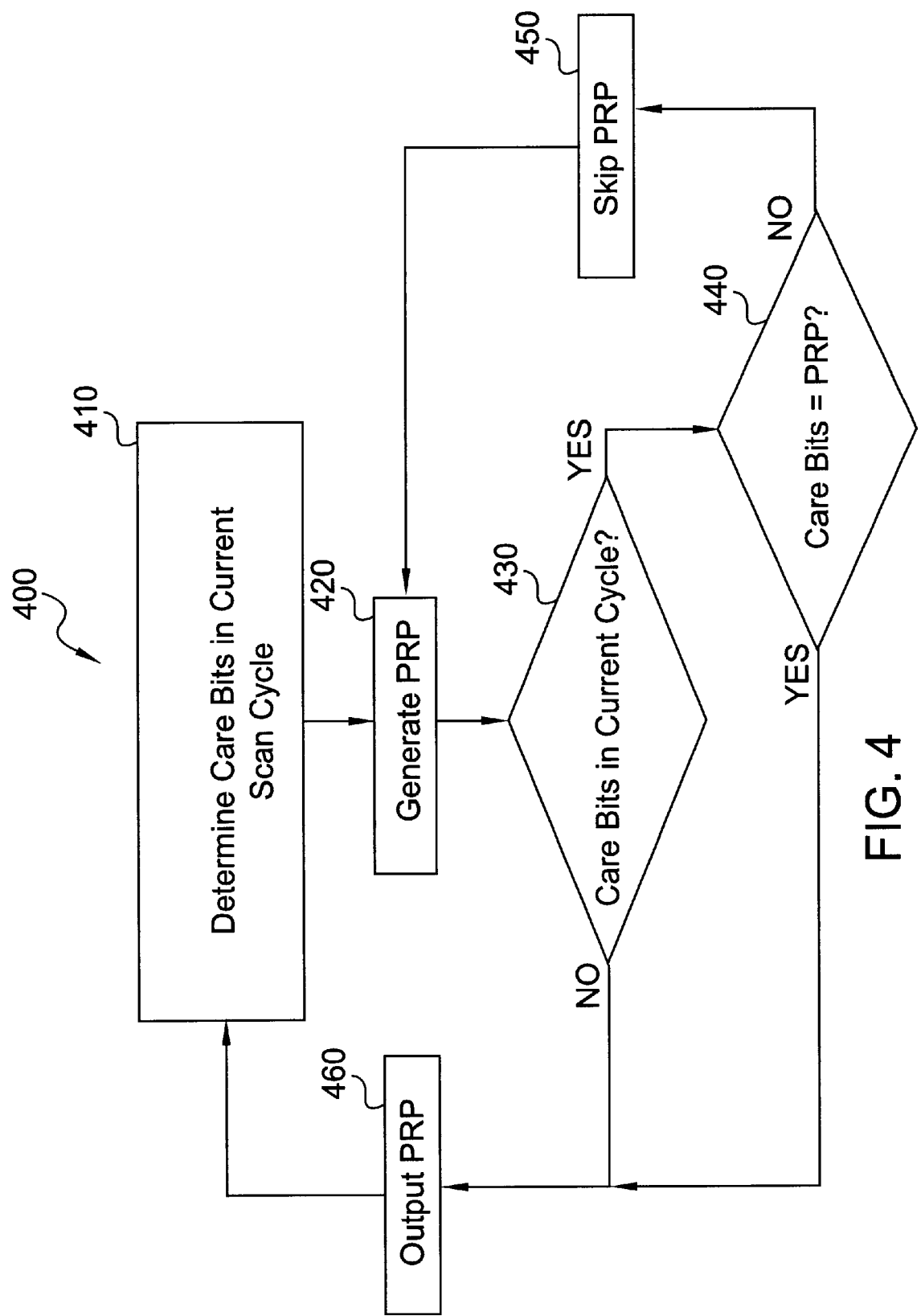
FIG. 4 is a method for deterministic random LBIST in accordance with a preferred embodiment of the present invention.
Figures 8, 9:
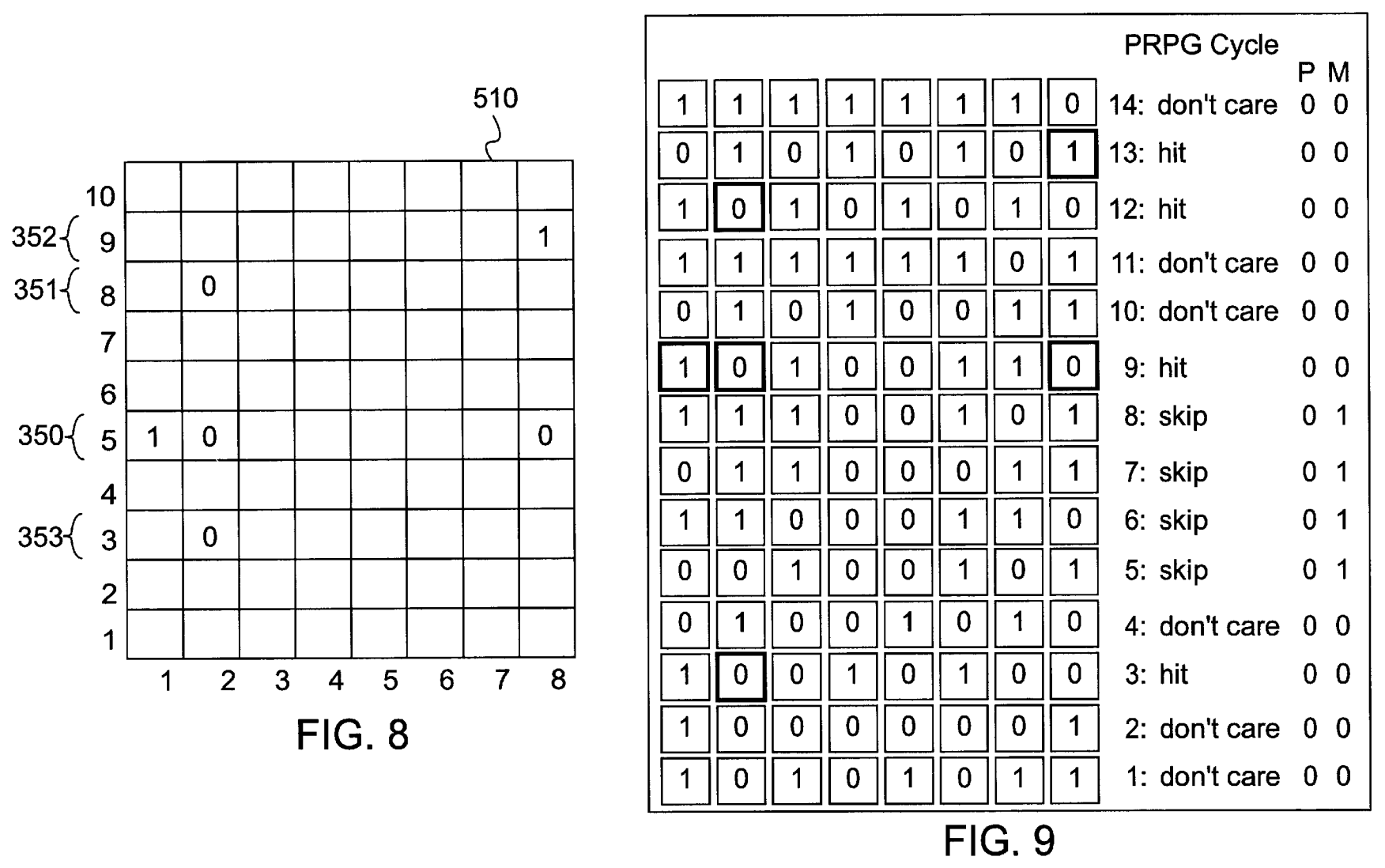

Referring now to FIGS. 3, 4, 8, and 9, FIG. 4 shows a preferred method for deterministic random LBIST, FIG. 8 shows the location and values of care bits, in appropriate scan cycles, needed to test a stuck at one fault for AND gate 320, and FIG. 9 shows the PRPG cycles created by method 400 of FIG. 4. FIG. 8 is used as a reference to determine where in the scan cycles the care bits are and what the care bits' values are. These figures will be used in combination to describe method 400.

Method 400 begins when the care bits in the current scan cycle are determined (step 410). In scan cycle one and two, there are no care bits. For these scan cycles, the pseudorandom pattern is generated (step 420), there are no care bits in the scan cycle (step 430=NO), so the pseudorandom pattern is output (step 460) and the method returns to step 410. The pseudorandom pattern is output, in FIG. 3, by allowing the PRPG, the scan channels, and the MISR to run and the P and M scan gate signals to be inactive. This allows data to flow through the scan channels.

For scan cycle three (also PRPG cycle 3) 353, the randomly generated pseudorandom pattern (step 420) happens to have a zero that lines up correctly with the care bit that is needed, in this cycle, to test the AND gate 320. In step 430, it is determined that there is a care bit in the current scan cycle (step 430=YES). In step 440, the pseudorandom pattern generated in this cycle has the necessary value at the correct location that coincide with the care bit needed for this scan cycle (step 440=YES). This can be seen in PRPG cycle three of FIG. 9. Thus, the pseudorandom pattern is output (step 460), and the method starts again at step 410.

Scan cycle four has no care bits, and cycles like this have been discussed. In scan cycle five 350, however, there are three care bits. When step 440 is reached, the currently generated pseudorandom pattern (seen in FIG. 9 as PRPG cycle five) does not contain these care bits (step 440=NO). Because of this, the pseudorandom pattern is skipped (step 450). To skip the pseudorandom pattern, the M scan gate signal is used to gate off the clocks going to the MISR and the scan channels. The PRPG runs, but the scan channels and MISR do not. No data is transferred through the scan channels, thus there is no scan cycle. Steps 420, 430, 440, and 450 will be repeated until the correct pseudorandom pattern is found that has the appropriate values of bits in the correct location as the required care bits. This happens in PRPG cycle nine, where the generated pseudorandom pattern contains the appropriate care bits. This pseudorandom pattern is output to the scan channels (step 460), and the M scan gate signal is deactivated.

It should be noted that the DSPT controller is executing instructions to activate or deactivate the P or M scan gate signals. Scan cycles six and seven do not have care bits, and are don't care cycles. These cycles correspond to PRPG cycles 10 and 11, and steps 410, 420, 430, and 460 are performed for each of these cycles. Scan cycle 8 351 does require a care bit (step 430=YES), and the PRPG contains a zero in the correct care bit location (step 440=YES). This pseudorandom pattern is output (step 460). The M scan gate signal is deactivated and the MISR and scan channels will scan data.

There is also a care bit required for scan cycle 9 352, and the pseudorandom pattern contains the correct care bit value in the correct care bit location (step 440=YES). This pseudorandom pattern is output and the next scan cycle is a don't care cycle, meaning that any pseudorandom pattern in the PRPG is output (PRPG cycle 14).

Thus, it takes 14 PRPG cycles to generate the 10 scan cycles. This will increase the time for this type of testing somewhat. However, it comes at less overall time because there are no large data transfers onto and off of the chip 350. It should also be pointed out that the simplicity of the example results in what is a relatively dense ratio of scan cycles containing care bits (4 out of 10 cycles) and an unusually wide combination where 50 percent of the care bits required for the test were in one cycle. The actual density of care bits in the scan channels will generally be much smaller, which will decrease the time necessary for deterministic LBIST. The relative benefit of the present invention is shown in reference to FIGS. 21 and 22, which are discussed below.

Figures 10, 11:
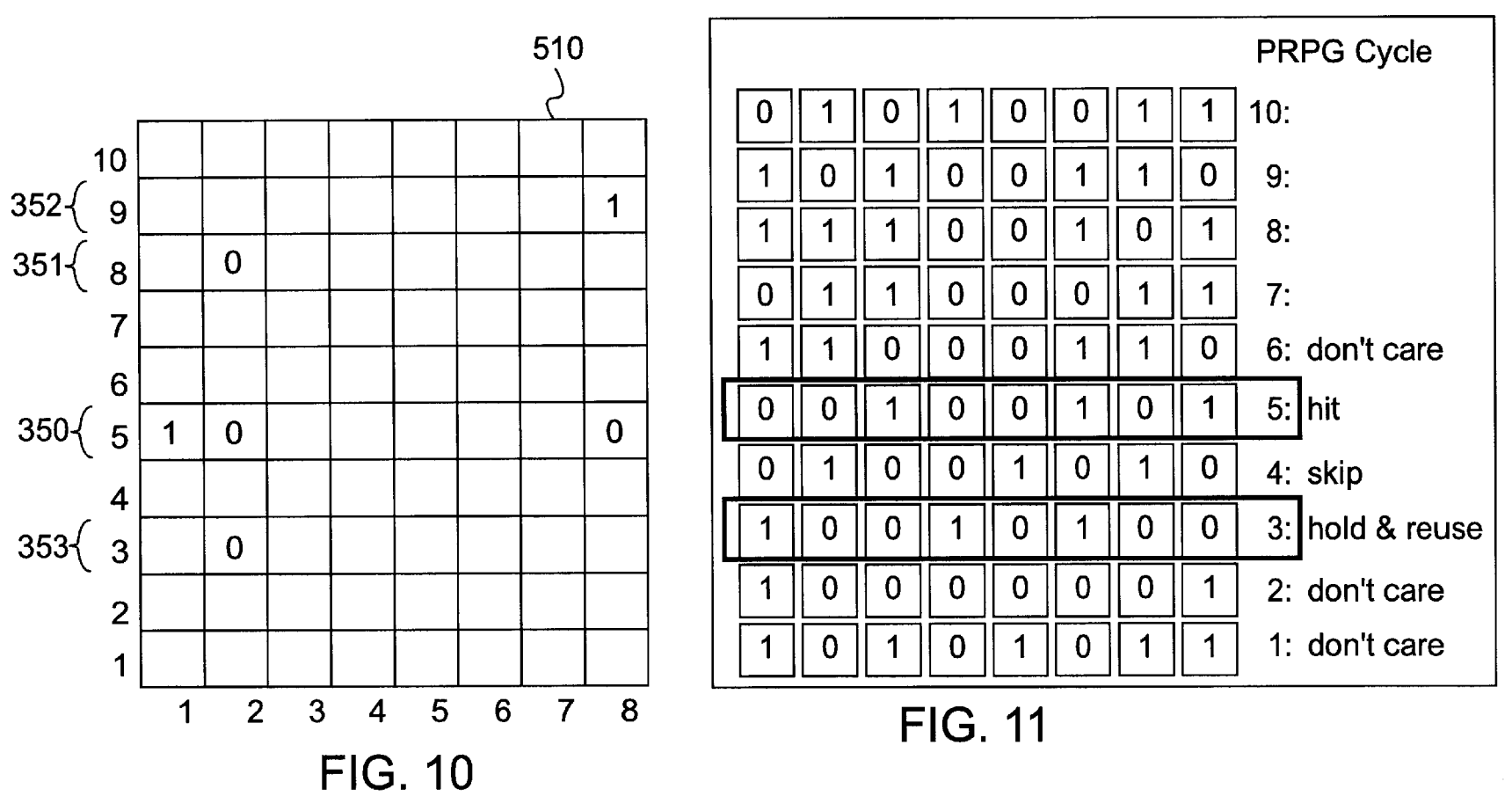

Another way of generating the required care bits is to "look ahead" to determine care bits in future scan cycles. Current pseudorandom patterns (having the appropriate care bit values in the appropriate care bit locations) in current scan cycles can then be held until and through the future scan cycle so that the pseudorandom pattern aligns with the future scan cycle. For instance, turning to FIGS. 10 and 11, FIG. 10 is a replica of FIG. 8, used for reference, and FIG. 11 is a representation of the PRPG cycles shown in FIG. 6. In FIG. 11, it can be seen that the PRPG cycle three could be used to generate care bits not only for scan cycle three but also for scan cycle five. PRPG cycle five can be used to generate care bits for scan cycles eight and nine. Instead of throwing PRPG cycles away, they can be used in subsequent scan cycles.

This "looking ahead" to future scan cycles may be performed any number of ways. In looking ahead, one could pick any scan cycle that has the needed care bits between the current cycle and the future scan cycle that requires them. Alternate algorithms for making the best choice where choices exist could be: take the first pseudorandom pattern that has the correct care bits; take any one; take the one closest to the scan cycle that requires them; or pick the one that is most useful in meeting subsequent care bit requirements.

Figure 12:
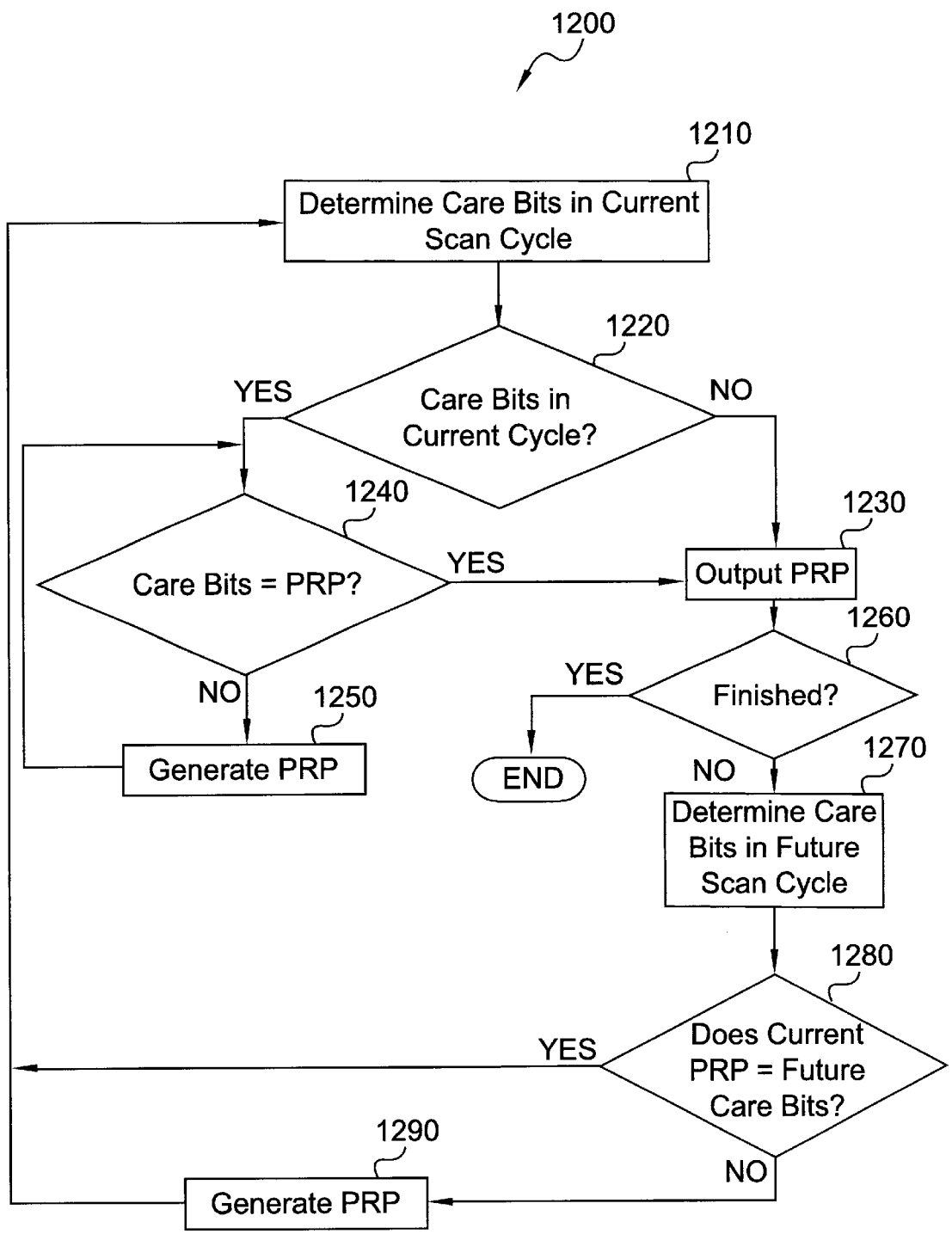
FIG. 12 is a method for deterministic random LBIST in accordance with a preferred embodiment of the present invention.
Figure 15:
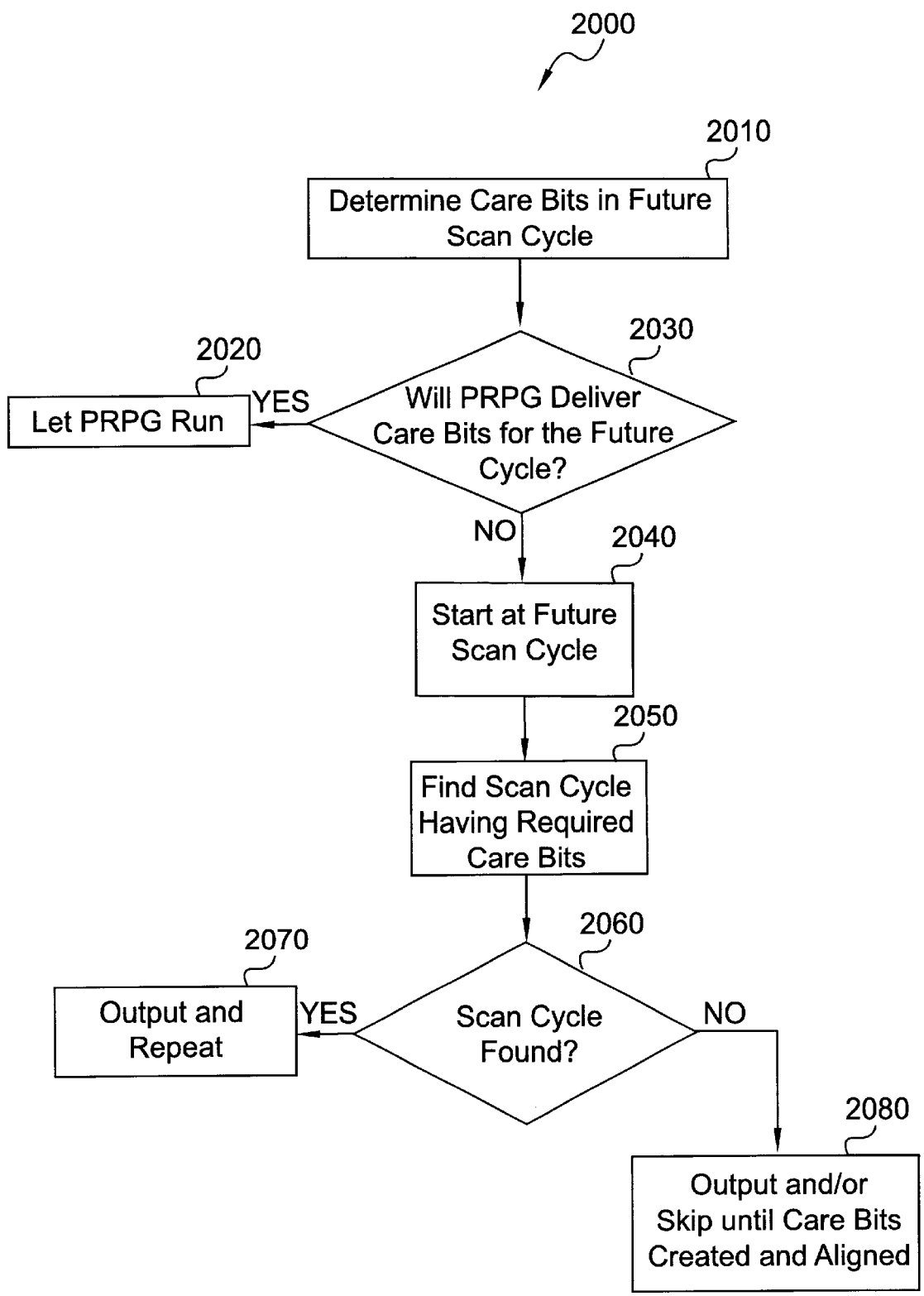
FIG. 15 is a method for deterministic random LBIST in accordance with a preferred embodiment of the present invention.

Two particular methods are discussed in FIGS. 12 and 15. In FIG. 12, the current scan cycle is used as the starting point, and the care bits needed at a future scan cycle are compared with the pseudorandom pattern generated at the current cycle. In FIG. 15, the future scan cycle is used as the start point, and the "previous" scan cycle's pseudorandom patterns are determined and the best match, if any, used to generate the care bits needed at the future scan cycle.

Figures 13, 14:
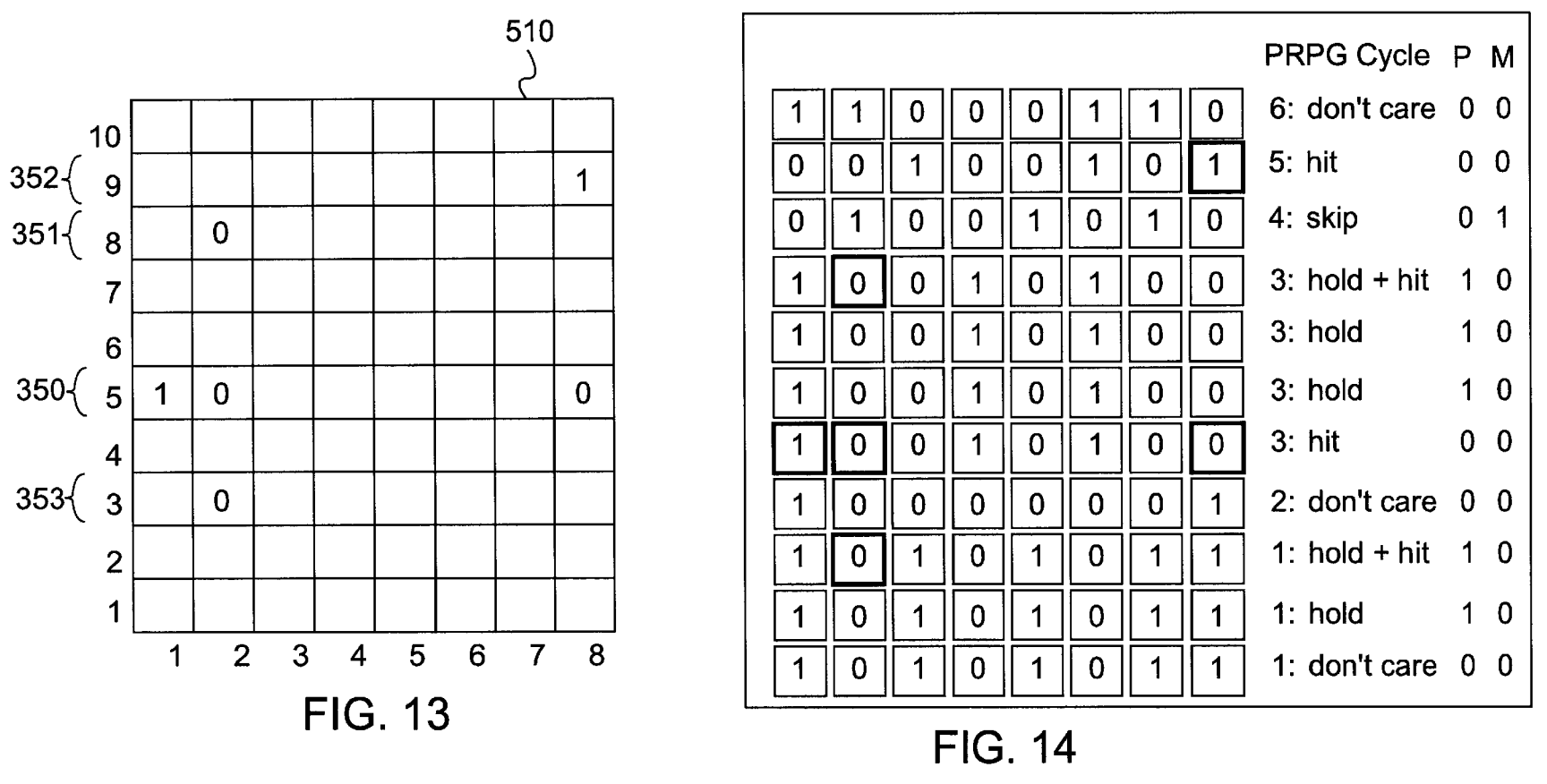

Turning now to FIGS. 3, 12, 13, and 14, FIG. 12 is a method for deterministic random LBIST, FIG. 13 is a replica of FIG. 8 (repeated here for reference), and FIG. 14 is a table of PRPG cycles generated through the method of FIG. 12. FIG. 13 contains the scan cycles used to test the AND gate

320, and it contains the proper care bit values in the proper care bit positions in the scan channels to test a stuck at one fault for AND gate 320. FIG. 14 contains a table of the PRPG cycles and pseudorandom patterns generated during the method of FIG. 12. Additionally, it contains a table of the status of the P and M scan gate signals. FIG. 14 will be used to discuss method 1200.

Method 1200 starts when the care bits in the current cycle are determined (step 1210). In scan cycle one, there are no care bits, which can be seen in FIG. 13. Because there are no care bits in the current scan cycle (step 1220), the starting state, the initial seed, of the pseudorandom pattern is output (step 1230). With nine scan cycles left, the method is not finished (step 1260=NO). The care bits for the future scan cycle are determined (step 1270), which means that the care bits for scan cycle 3 353 are determined. The current pseudorandom pattern contains the care bit for scan cycle 3 353 (step 1280=YES), so the pseudorandom pattern is held for the future cycle. To hold the pseudorandom pattern, the P scan gate signal is activated (FIG. 14) to gate off the clock(s) that advance the PRPG 310. The clocks to the scan channels and MISR are not gated off.

In scan cycle 2, there are no care bits, the method follows the same steps (1210, 1220, 1230, 1260, 1270) as it did for scan cycle one. It outputs the pseudorandom pattern for scan cycle 2, and continues to hold it for future scan cycle 3 353.

Scan cycle 3 353 is the future scan cycle for which the pseudorandom pattern has been held. It is determined that a care bit is required in the current scan cycle (steps 1210 and 1220=YES), and that the pseudorandom pattern contains the care bit (step 1240=YES). The pseudorandom pattern is output (step 1230). Continuing (step 1260=NO), the care bits for the future scan cycle 5 350 are determined (step 1270). The current pseudorandom pattern does not have the three care bits required by the future scan cycle (step 1280=NO). A new pseudorandom pattern (PRPG cycle 2) is generated (step 1290).

Scan cycle 4 does not require care bits and the pseudorandom pattern is output. Continuing, the method determines that this pseudorandom pattern does not have the care bits required by the future scan cycle 5 350. Another pseudorandom pattern (PRPG cycle 3) is generated.

Scan cycle 5 350 is the next scan cycle. It is determined that care bits are required in the current cycle (steps 1210 and 1220=YES), and that the pseudorandom pattern (PRPG cycle 3) contains the three required care bits (step 1240=YES). The pseudorandom pattern is output (step 1230). Continuing (step 1260=NO), the care bits for the future scan cycle 8 351 are determined (step 1270). The current pseudorandom pattern (PRPG cycle 3) also has the care bit required by this next future scan cycle (step 1280=YES).

Scan cycles 6 and 7 require no care bits, the method follows the same steps as it did for scan cycle 2. The pseudorandom pattern (PRPG cycle 3) is output for scan cycles 6 and 7, and held for future scan cycle 8 351.

Scan cycle 8 351 is the future scan cycle for which the pseudorandom pattern has been held. The method follows the same steps as it did for scan cycle 3. The pseudorandom pattern (PRPG cycle 3) with the care bit is output. Scan cycle 9 352 is determined to be the next future scan cycle requiring at least one care bit. The method determines the current pseudorandom pattern does not have the required care bit. A new pseudorandom pattern is generated (PRPG cycle 4).

In scan cycle 9, the method determines that a care bit is required (steps 1210, 1220=YES), but that the newly generated pseudorandom pattern does not meet this care bit (step 1254=NO). Thus, the pseudorandom pattern generated by PRPG cycle 4 is skipped (step 1250). This can be seen in FIG. 14, where the fourth PRPG cycle is skipped by gating the MISR and scan channel clocks but leaving the PRPG to run.

At PRPG cycle 5, the PRPG 310 generates a pseudorandom pattern having the correct care bit, at the correct value and in the correct scan channel position, for scan cycle 9 352 (step 1240=YES). The pseudorandom pattern is output (step 1260). With one scan cycle left (step 1260=NO), the method determines there are no future cycles requiring care bits (steps 1270, 1280=NO). A new pseudorandom pattern (PRPG cycle 6) is generated (step 1290).

Finishing up, this last pseudorandom pattern is output and the method determines that all 10 scan cycles have been completed (step 1260=YES).

Method 1200 is a forward looking method that starts at the current scan cycle and looks forward to the future scan cycle that needs care bits. A current scan cycle having the proper care bits is aligned with the future scan cycle by skipping other pseudorandom patterns that do not have the proper care bits or by holding the pseudorandom pattern that does have the proper care bits. However, this particular method can be somewhat inefficient. An alternate method is to start at the future scan cycle and look backwards to find an appropriate scan cycle that has the necessary care bits.

Figures 16, 17:
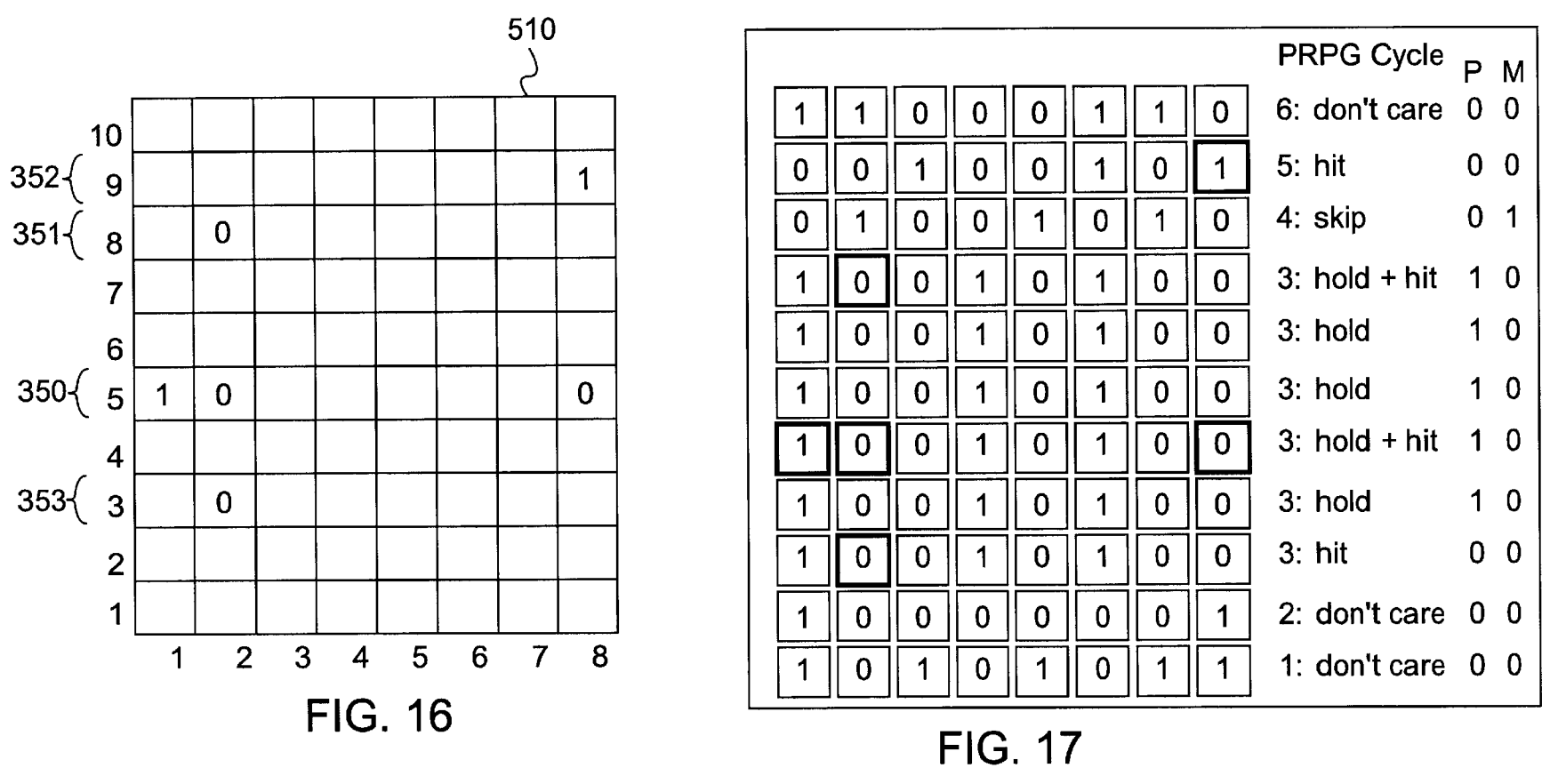

Method 2000 of FIG. 15 is such a method. Turning to FIGS. 15, 16, and 17 in addition to FIG. 3, FIG. 15 is a method for deterministic random LBIST, FIG. 16 is a replica of FIG. 8 (repeated here for reference), and FIG. 17 is a table of PRPG cycles generated through the method of FIG. 15. FIG. 16 contains the scan cycles used to test the AND gate 320, and it contains the proper care bit values in the proper care bit positions in the scan channels to test a stuck at one fault for AND gate 320. FIG. 17 contains a table of the PRPG cycles and pseudorandom patterns generated during the method of FIG. 15. Additionally, it contains a table of the status of the P and M scan gate signals. FIG. 17 will be used to discuss method 2000.

Method 2000 starts when the care bits in a future scan cycle are determined (step 2010). The scan cycles of the PRPG are examined to determine if the PRPG would naturally (without intervention) produce the required care bits at the future cycle. This occurs in step 2020. For instance, in FIG. 17, the third PRPG cycle will produce the proper care bits for scan cycle 3 353. In this case, the PRPG is allowed to run without any type of intervention. For the second set of care bits, at scan cycle 5 350, these are harder to meet. In step 2030, it is determined that the PRPG will not naturally produce these care bits (step 2030=NO). During simulation, the method can start at the future scan cycle (step 2040) and attempt to find a pseudorandom pattern that would be produced by the PRPG that also meets the required scan bits (step 2050). If there is such a pseudorandom pattern produced in an earlier cycle (step 2060=YES), this cycle is selected and the pseudorandom pattern is output and held through the future cycle.

For instance, in FIG. 17, the pseudorandom pattern produced for PRPG cycle 3 also meets the care bit requirements for scan cycles 5 350 and 8 351. Thus, the pseudorandom pattern produced by the PRPG during PRPG cycle 3 (which is also scan cycle 3 353) is held by gating the PRPG clock(s) through and until the future cycles (step 2070). In FIG. 17, this results in the third pseudorandom pattern being held for five PRPG and scan cycles and being initially output during one PRPG and scan cycle.

If the scan cycle is not found in the scan cycles that naturally occur, the pseudorandom patterns generated during the scan cycles may be skipped and/or output until the care bits are created and aligned with the future scan cycle. For example, after the pseudorandom pattern in PRPG cycle 3 is held and output, the very next scan cycle (scan cycle 9 352) needs the opposite value care bit in the eighth scan channel. The pseudorandom pattern generated in PRPG cycle 4 does not contain this care bit, so another PRPG cycle is performed and the pseudorandom pattern from PRPG cycle 4 is skipped by stopping the clock(s) that go to the MISR and the scan channels (step 2080). During the next PRPG cycle, the PRPG produces a pseudorandom pattern having the correct bit having the proper value and in the correct location, so this pseudorandom pattern is output (step 2080).

It should be noted that method 2000 may be modified to search for the best scan cycle of all of the scan cycles needed to meet FIG. 16. For instance, scan cycle 5 350 has the most care bits, and these care bits also meet the care bits for scan cycles 3 353 and 8 351. Thus, finding a scan cycle that meets the care bits for scan cycle 5 350 and then repeating this pseudorandom pattern for the scan cycles 3 353, 5 350, and 8 351 will be one of the most efficient manners to meet most of the care bits of the scan cycles. Method 2000 may be modified to look for these types of pseudorandom patterns in the prior scan cycles.

Thus, method 2000 attempts to match a current pseudorandom pattern that has the correct care bits in the correct position, as needed by a future scan cycle, with the future scan cycle.

Figure 18:
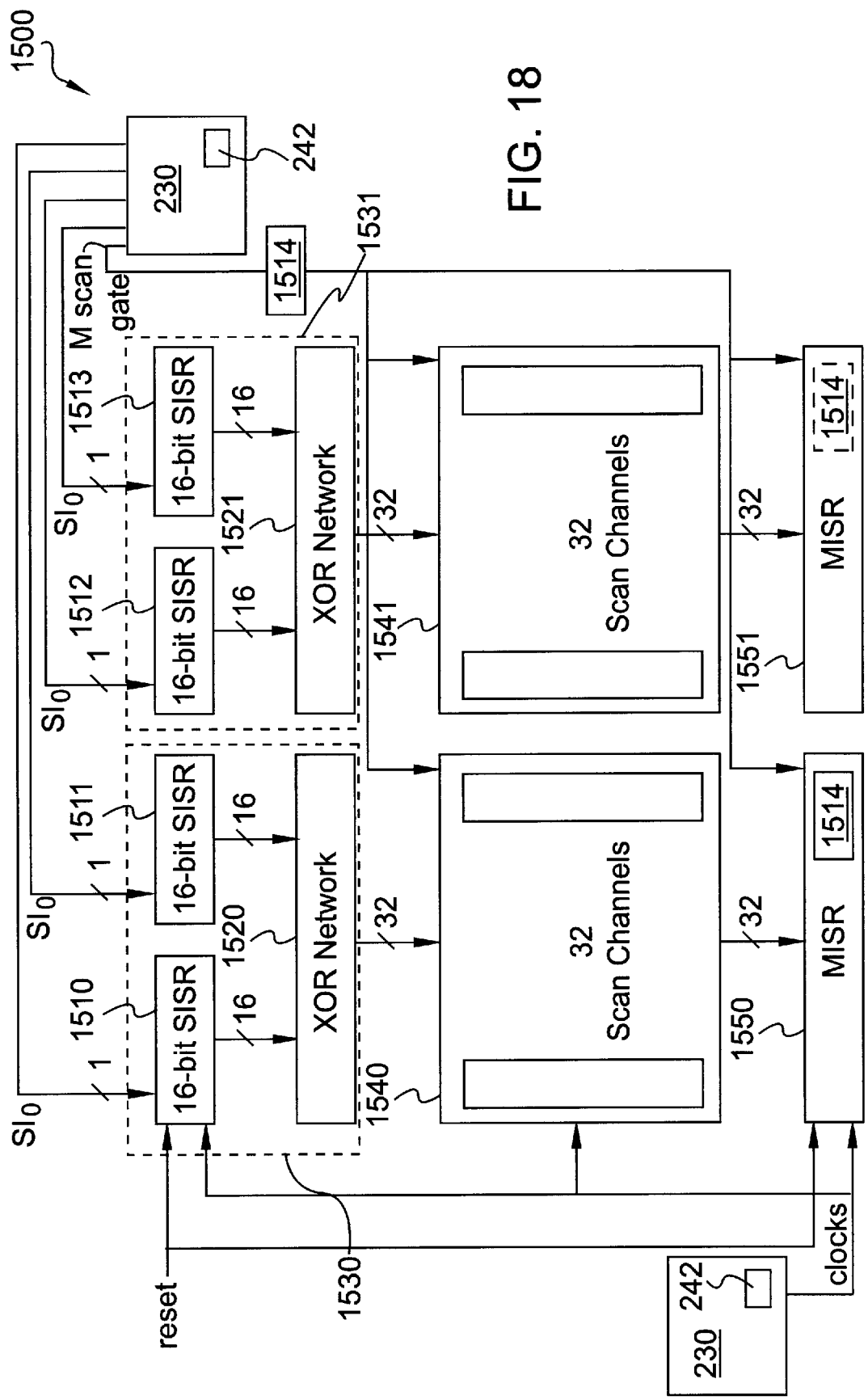
FIG. 18 is a system for testing a chip in accordance with a preferred embodiment of the present invention.

Turning now to FIG. 18, a system 1500 is shown that can be used to test a computer chip with deterministic patterns. The computer chip in this example comprises four 16 bit Single Input Signature Registers (SISRS) 1510, 1511, 1512, 1513, each having a scan in input, two XOR networks 1520, 1521, scan channels 1540, 1541, MISRs 1550, 1551, and clock gating devices 1514. Clock gating devices 1514 are preferably in the clock tree to the scan channels and MISR, but may also be part of the scan devices (such as SRLs) or the MISR. The 16 bit SISRs 1510, 1511, 1512, 1513 may be thought of as a PRPG. Alternatively, SISRs 1510, 1511 and XOR network 1520 may be thought of as one PRPG, while SISRs 1512, 1513 and XOR network 1521 may be thought of as another PRPG. The XOR networks remove some linear dependencies from the SISRs.

In this embodiment, the future care bits for a future scan cycle may be determined. The scan in inputs may then be perturbed such that the future care bits are generated in the proper positions and at the correct values for the future scan cycle.

The feedback structure for this SISR is shown in FIG. 7. In this example, the SI is an additional input to an XOR gate feeding the left most latch of the SISR. The second input to the XOR is the feedback coming from the rightmost latch of the SISR (see FIG. 7). Thus, the SI value is XORed with the value coming back from that right most latch. The leftmost latch of the SISR gets the result of this XOR. Therefore, setting the SI to zero (or setting one input of the XOR to zero) has no effect on the feedback value. The leftmost latch of the SISR will get whatever state was in the rightmost latch in the prior SISR cycle. By placing a zero on the SI, one in fact is holding that input in such a way that the SISR functions as a closed PRPG. On the other hand, setting the SI to a one (setting a leg of the two input XOR to a one) will invert the feedback value. This is a "nudge". In this case, the leftmost latch of the SISR will get the inverse of the state that was in the rightmost latch in the prior cycle. Setting up a care bit, or bits, requires positioning a particular state(s) at a particular SISR position(s) at a particular cycle. This requires that the offline simulation model change the cycle by cycle SISR states and calculate when inverting the state in the leftmost latch would be useful.

Figures 19, 20:
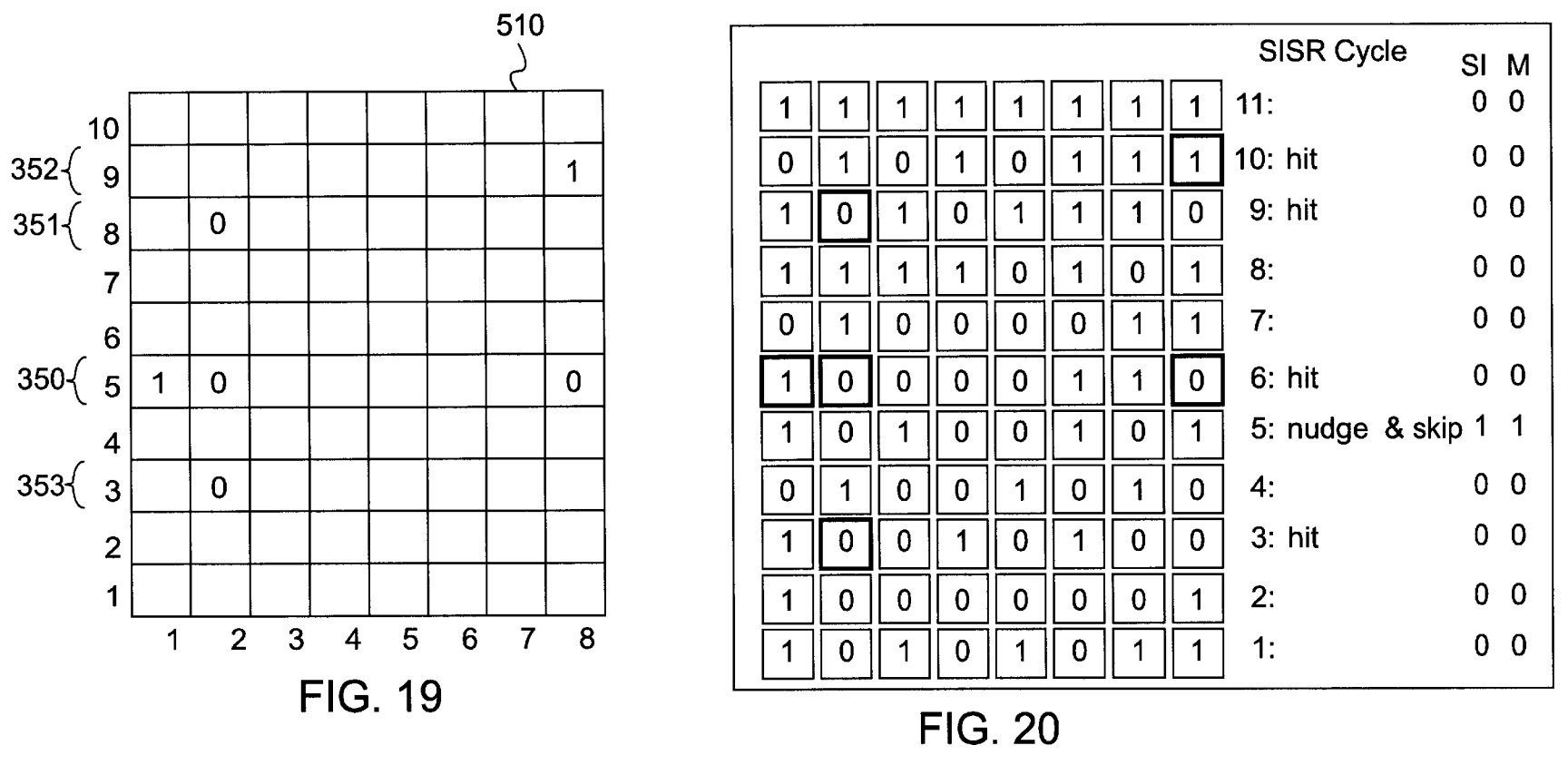

Turning to FIGS. 19 and 20 in addition to FIG. 18, FIG. 19 is a replica of FIG. 8 (repeated here for reference), and FIG. 20 is a table of PRPG cycles generated through the method of FIG. 1, as modified by the previous paragraph. In FIG. 20, it can be seen that scan cycle 19 is the hardest scan cycle for which to meet the scan bits. The system 1500 tries to align the care bits with the scan cycle and scan channels by nudging the SISRs in the correct direction. If the nudging occurs correctly, few or no SISR cycles will be skipped. In the example of FIG. 20, the system 100 (according to instructions derived from a previous offline simulation) would nudge the SISR cycle number 5. This is done by making the SI input a high value. However, this pseudorandom pattern must be skipped by gating off the clock(s) going to the MISR and the scan channels. These actions result in the proper scan bits at scan cycle 5 (SISR cycle 6). The other scan cycles, in this example, did not need nudging.

Thus, by a combination of adding data to a SISR and perhaps skipping pseudorandom patterns, the invention of FIG. 18 aligns a pseudorandom pattern having suitable care bits with a future scan cycle that needs those care bits to test a logic device.

Figure 21:
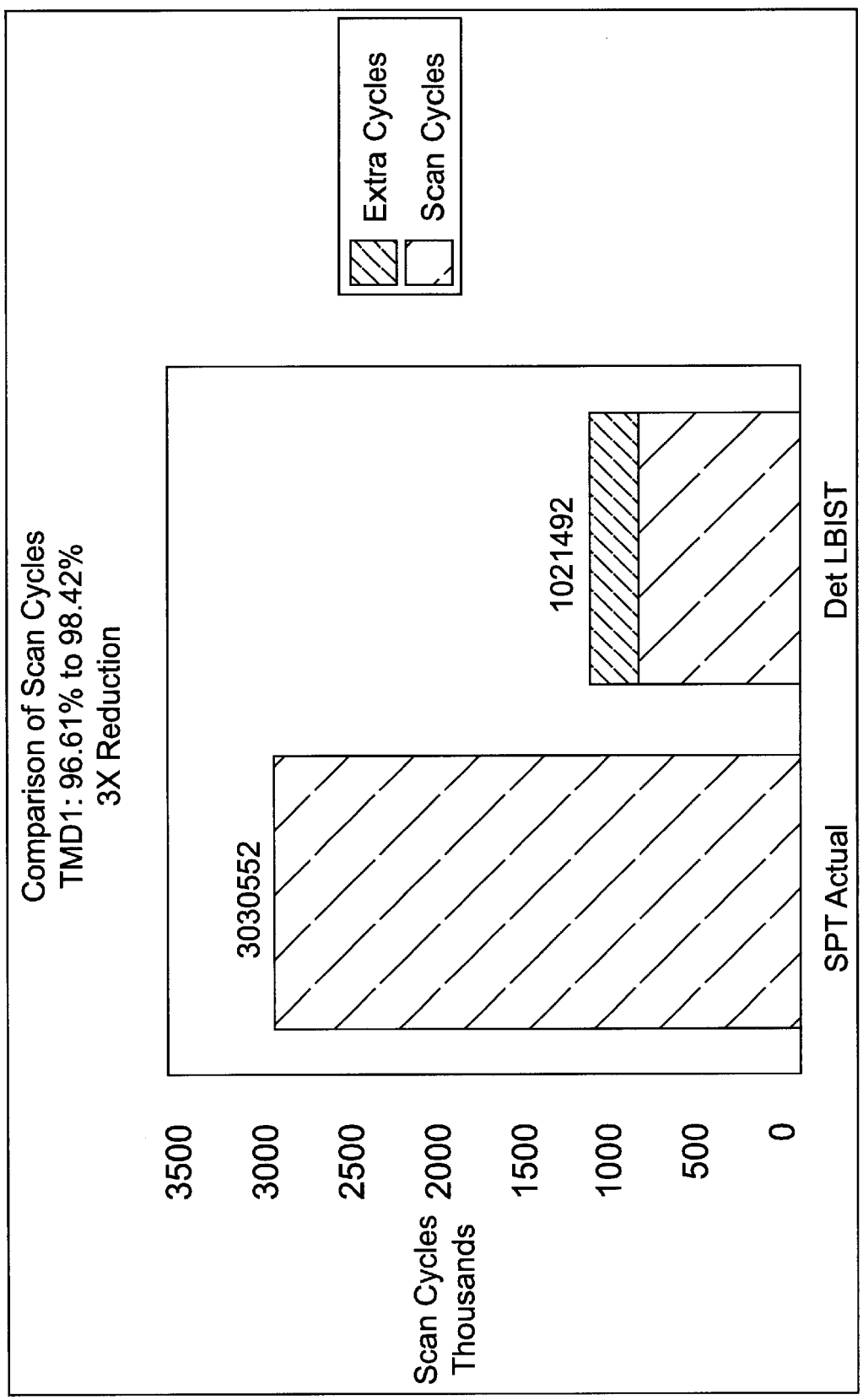
FIGS. 21 and 22 are comparisons of the number of testing cycles for both prior art testing and the deterministic random LBIST of the present invention.

Referring to FIG. 21, this figure shows a graph of the number of scan cycles for two different tests. The same ASIC (Application Specific Integrated Circuit) device was modeled and tested under DSPT and deterministic random LBIST. In the analysis of this ASIC device, deterministic LBIST has been shown to have a 3X savings over Deterministic Stored Pattern Test in the number of scan cycles required to cover the faults on the tail of the fault coverage curve. The reason for looking at the tail of the curve was that the tail of the fault coverage curve had been beyond the reach of random LBIST. But, this ASIC device fits on today's testers. It does not require the deterministic LBIST's internal bandwidth and short scan channels to be tested cost effectively. However, there are much larger parts on the horizon. These will be much too large to utilize Stored Pattern Tests (SPTs) on today's testers. So, the next relevant question is, how well does Deterministic LBIST scale to much larger parts? The answer lies in the characteristic of Deterministic LBIST that required only two tester scan I/O (Input/Output) to test the ASIC part. This leaves many other scan I/O available to scale Deterministic LBIST to much larger parts.

This ASIC part could be thought of as a chiplet within a much larger part. The Deterministic LBIST for the chiplet would require only two tester scan I/O. One would gate the scan clocks to all the scan channels and the MISR for this chiplet and all the other chiplets, in the large device. The second scan I/O would gate the clocks to the PRPG specific to this chiplet. All remaining tester scan I/O could be assigned to control the PRPGs to other chiplets in the larger part. The device size could increase 30X on today's testers that have 32 scan I/Os. Assuming all the chiplets had roughly the same number of scanable latches as the chiplet being modeled then the length of the length of the Deterministic LBIST scan channels would stay at about 512.

Figure 22:
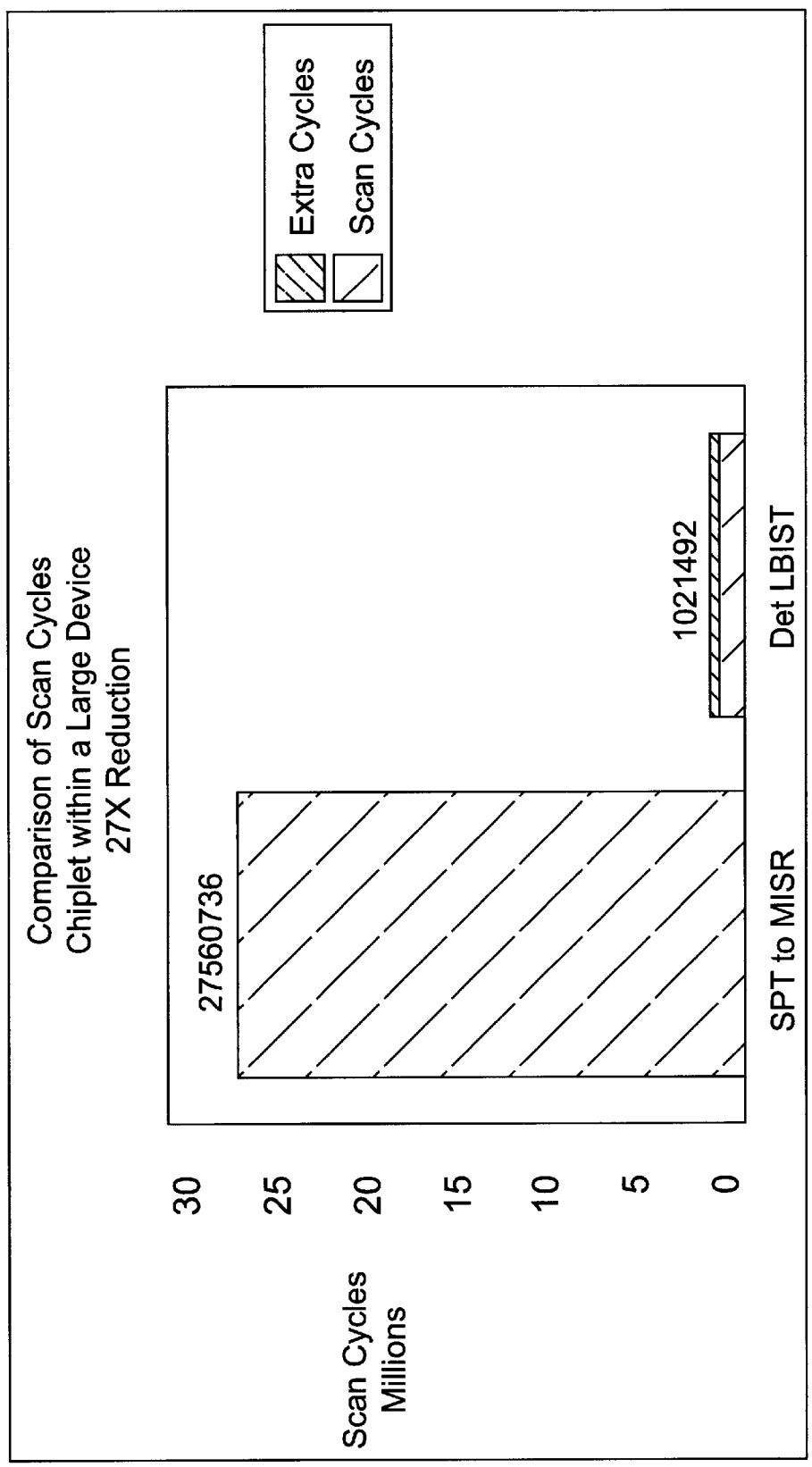

Referring to FIG. 22, this figure shows a graph of the number of scan cycles for two different tests. This graph is modeled data from a computer chip. On the left is the actual number of scan cycles to test the chip using normal DSPT. On the right is a corresponding graph for a model of the chip, with the P scan gate signal added. This model describes a large part with 496 thousand (K) scannable latches, but its scan length is only 512. The large part is defined as 31 repetitions of the same LBIST design macro, each with a 32 bit PRPG having 32 scan channels that are 512 latches long, a MISR, and a scan gate signal (P scan gate signal) controlling its PRPG. A single global scan gate signal would control the shifting of all the scan channels and MISR. The ASIC (Application Specific Integrated Circuit) part from which the test data was collected is assumed to be one of the 31 chiplets in the large part. In summary, this very large part would have 496K scannable latches. With Deterministic LBIST it would use just 32 tester scan input/output pins and have a short scan length of 512.

Using the model of this large part, the deterministic LBIST test method can be compared to the stored pattern test method. A stored pattern test uses all but one of the available tester scan input/output (I/O) pins as scan in pins. It reserves the one other scan I/O to observe the MISR. So, a stored pattern test would have the same requirements on tester resources as would the deterministic LBIST for this large part. But, the stored pattern test requires a scan length 16 K since the tester scan I/O must directly feed and load the scan latches.

The bar chart of FIG. 22 represents the scaling of this deterministic LBIST to the larger part. It compares the scan cycles required to test the last 2% of the faults within the chiplet within a much larger part using both a stored pattern test and deterministic LBIST. Since the other 30 chiplets modeled in this large part would be tested in parallel with either a stored pattern test or deterministic LBIST, the chart is a pretty fair comparison of the two test methods. For this particular part, there is a 27 times reduction when comparing SPT to deterministic random LBIST of the current invention.

What has been shown is deterministic random Logic Built In Self Test (LBIST) that applies Deterministic Stored Pattern Tests (DSPTs) by using random LBIST. Basically, the present invention selects the appropriate pseudorandom pattern for use with a scan cycle that needs care bits and it aligns the pseudorandom pattern with that scan cycle.

While the invention has been particularly shown and described with reference to preferred embodiments thereof, it will be understood by those skilled in the art that various changes in form and details may be made therein without departing from the spirit and scope of the invention. Accordingly, unless otherwise specified, any dimensions of the apparatus indicated in the drawings or herein are given as an example of possible dimensions and not as a limitation. Similarly, unless otherwise specified, any sequence of steps of the method indicated in the drawings or herein are given as an example of a possible sequence and not as a limitation.

What is claimed is:

1. A computer chip comprising:
   a plurality of scan channels;
   at least one pseudorandom pattern generator (PRPG) coupled to the plurality of scan channels
   a P clock tree;
   a P scan gate signal;
   a P clock gating device coupled to the P clock and the PRPG, the P clock gating device responsive to a P scan gate signal to independently gate at least a portion of the P clock tree, wherein the PRPG is stopped from advancing to a new pattern;
   at least one Multiple Input Serial Register (MISR) coupled to the plurality of scan channels;
   an M scan gate signal;
   an M clock tree; and
   an M clock gating device coupled to the M clock tree, MISR and scan channels, the M clock gating device responsive to the M scan gate signal to independently gate at least a portion of the M clock tree, wherein the MISR and devices in the scan channels are stopped from shifting.

2. The computer chip of claim 1 wherein the PRPG is a Single Input Signature Register (SISR) comprising at least one input.

3. A method for testing a computer chip having a plurality of scan channels, the method comprising the steps of:
   a) determining at least one care bit, of a plurality of scan bits in the scan channels, in one of a plurality of scan cycles, wherein the at least one care bit is tests at least one logic device for proper operation when the at least one care bit is at least one predetermined value, is aligned with the one scan cycle, and is properly positioned within the scan bits of the scan channels;
   b) generating at least one pseudorandom pattern; and
   c) align one of the at least on pseudorandom patterns with the one scan cycle, wherein the one pseudorandom pattern comprises the at least one care bit at the at least one predetermined value to initialize and in the proper position, thereby testing the at least one logic device.

4. The method of claim 3 wherein the at least one care bit comprises a plurality of care bits, wherein the at least one predetermined value comprises one predetermined value for each of the care bits, and wherein the plurality of care bits test at least one logic device for proper operation when each of the plurality of care bits is one of the predetermined values, the plurality of care bits are aligned with the one scan cycle, and the plurality of care bit are properly positioned within the scan bits.

5. The method of claim 3 where:
   the step of determining at least one care bit, of a plurality of test bits, in one of a plurality of scan cycles comprises the step of determining the at least one care bit in a future scan cycle;
   the step of generating at least one pseudorandom pattern comprises the step of modifying an input bit of a current pseudorandom pattern during a current scan cycle; and
   the step of aligning one of the at least one pseudorandom patterns with the one scan cycle comprises the step of modifying the input bit during the current scan cycle that is a predetermined number of scan cycles before the future cycle, wherein the input bit is modified and the predetermined number of scan cycles is selected so that a future pseudorandom pattern comprises the at least one care bit at the at least one predetermined value and in the proper position.

6. The method of claim 3
   wherein the step of determining at least one care bit, of a plurality of scan bits, in one of a plurality of scan cycles comprises the step of determining a plurality of future care bits in a plurality of future scan cycles, each future scan cycle comprising at least one of the future care bits;
   wherein the step of generating at least one pseudorandom pattern comprises determining a plurality of interim pseudorandom patterns that would be generated in scan cycles prior to a latest of the future scan cycles; and wherein the step of aligning one of the at least one pseudorandom patterns with the one scan cycle comprises the steps of:
  i) determining if one of the plurality of interim pseudorandom patterns has appropriate future care bits for more than one of the future scan cycles; and
  ii) if there is one interim pseudorandom pattern that has the appropriate future care bits for more than one of the future scan cycles, outputting the one interim pseudorandom pattern during each of the more than one future scan cycles.

7. The method of claim 3 wherein the step of aligning the at least one pseudorandom pattern with the one clock cycle comprises the step of stopping a PseudoRandom Pattern Generator (PRPG).

8. The method of claim 7 wherein the step of stopping a PRPG comprises gating off at least one clock that couples to the PRPG.

9. The method of claim 7 further comprising the step of stopping the scan channels and a Multiple Input Signature Register (MISR).

10. The method of claim 8 further comprising the stop of gating off at least one clock that couples to the scan channels and to the MISR.

11. The method of claim 3 wherein the one scan cycle is a future scan cycle.

12. The method of claim 11 wherein the one pseudorandom pattern is generated in a current scan cycle and is output in the future scan cycle.

13. The method of claim 12 wherein the step of aligning one of the least one pseudorandom patterns with the one scan cycle comprises the steps of:
  i) determining a pseudorandom pattern in scan cycles from the current scan cycle to the future scan cycle that comprises the at least one care bit at the at least one predetermined value and in the proper position to test the at least one logic device; and
  ii) outputting the pseudorandom pattern determined in step (i) during the future scan cycle.

14. The method of claim 3 wherein the one scan cycle is a current scan cycle.

15. The method of claim 3 wherein each scan channel comprises a plurality of Level Sensitive Scan Design (LSSD) Shift Register Latches (SRLs).

16. A method for testing a computer chip having a plurality of scan channels, the method comprising the steps of:
  a) determining at least one care bit of a plurality of scan bits in the scan channels, in one of a plurality of scan cycles, wherein the at least one care bit tests at least one logic devices for proper operation when the at least one care bit is at least one predetermine value, is aligned with the one scan cycle, and is properly positioned within the scan bits of the scan channels;
  b) generating at least one pseudorandom pattern;
  c) aligning one of the at least one pseudorandom patterns with the one scan cycle, wherein the one pseudorandom pattern comprises the at least one care bit at the at least one predetermined value and in the proper position thereby testing the at least one logic device;
  wherein the step of determining at least one care bit, of a plurality of scan bits, in one of a plurality of scan cycles comprises the step of determining if there are any care bits in a current scan cycle;
  wherein the step of generating at least one pseudorandom pattern comprises generating a current pseudorandom pattern in the current scan cycle; and
  wherein the step of aligning one of the at least one pseudorandom patterns with the one scan cycle comprises the steps of:
  i) outputting the current pseudorandom pattern if there are no care bits in the current scan cycle; and
  ii) if there are care bits in the current scan cycle, performing the following steps:
    A) if the at least one care bit is the at least one predetermined value, is aligned with the one scan cycle, and is properly positioned within the scan bits, outputting the current pseudorandom pattern, else skipping the current pseudorandom pattern;
    B) generating a new pseudorandom pattern that becomes the current pseudorandom pattern; and
    C) performing (A) and (B) until the current pseudorandom pattern is out.

17. A method for testing a computer chip having a plurality of scan channels, the method comprising the steps of:
  a) determining at least one care bit, of a plurality of scan bits in the scan channels, in one of a plurality of scan cycles, wherein the at least one care bit tests at least one logic device for proper operation when the at least one care bit is at least one predetermined value, is aligned with the one scan cycle, and is properly positioned within the scan bits of the scan channels;
  b) generating at least one pseudorandom pattern;
  c) aligning one of the at least one pseudorandom patterns with the one scan cycle, wherein the one pseudorandom pattern comprises the at least one care bit at the at least one predetermined value and in the proper position, thereby testing the at least one logic device;
  wherein the step of determining at least one care bit, of a plurality of scan bits, in one of a plurality of scan cycles comprises the step of determining if there are any current care bits in a current scan cycle;
  wherein the step of determining at lest one pseudorandom pattern comprises generating a current pseudorandom pattern in the current scan cycle; and
  wherein the step of aligning one of the at least one pseudorandom pattern with the one scan cycle comprises the steps of:
  i) outputting the current pseudorandom pattern if there are no current care bits in the current scan cycle;
  ii) if there are current care bits in the current scan cycle, performing the following steps;
    A) if the at least one current care bit is the at least one predetermined value, is aligned with the one scan cycle, and is properly positioned within the scan bits, outputting the current pseudorandom pattern, else skipping the current pseudorandom pattern;
    B) generating a new pseudorandom pattern that becomes the current pseudorandom pattern; and
    C) performing steps (i) and (ii) until the current pseudorandom pattern is output; and
  iii) determining at least one future care bit for a future scan cycle, the at least one future care bit having at least one predetermined value and a properly position within the scan bits; and
  iv) if the current pseudorandom pattern has the at least one predetermined value, properly positioned within the scan bits, for the at least one future care bit, outputting the pseudorandom for the cycles between the current scan cycle until and including the future scan cycle.

18. A method for testing a computer chip having a plurality of scan channels, the method comprising the steps of:
   a) determining at least one care bit, of a plurality of scan bits in the scan channels in one of a plurality of scan cycles, wherein the at least bit tests at least one logic device for proper operation when the at least one care bit is at least one predetermined value, is aligned with the one scan cycle, and is properly positioned within the scan bits of the scan channels;
   b) generating at least one pseudorandom pattern;
   c) aligning one of the at least one pseudorandom patterns with the one scan cycle, wherein the one pseudorandom pattern comprises the at least one care bit at the at least one predetermined value and in the proper position, thereby testing the at least one logic device:
      the step of determining at least one care bit of a plurality bits, in one of a plurality of scan cycles comprises the step of determining the at least one care bit in a future scan cycle;
      the step of generating at least one pseudorandom pattern comprises the step of modifying an input bit of a current pseudorandom pattern during a current scan cycle: and
      the step of aligning one of the at least one pseudorandom patterns with the one scan cycle comprises the step of modifying the input bit during the current scan cycle that is a predetermined number of scan cycles before the future cycle, wherein the input bit is modified and the predetermined number of scan cycles is selected so that a future pseudorandom pattern comprises the at least one care bit at the at least one predetermined value and in the proper position; and
      wherein the step of aligning one of the at least one pseudorandom patterns with the one scan cycle further comprises:
         i) skipping the current pseudorandom pattern if the current cycle aligns with the future scan cycle but will not comprise the at least one care bit at the at least one predetermined value and in the proper position;
         ii) generating a new pseudorandom pattern, wherein the input bit is modified and the predetermined number of scan cycles is selected so that the new pseudorandom pattern comprises the at least one care bit at the at least one predetermined value and in the proper position;
         iii) outputting the new pseudorandom pattern during the future scan cycle.

19. A method for testing a computer chip having a plurality of scan channels, the method comprising the steps of:
   a) determining at least one care bit, of a plurality of scan bits in the scan channels, in one of a plurality of scan cycles, wherein the at least one care bit tests at least one logic device for proper operation when the least one care bit is at least one predetermined value, is aligned with the one scan cycle, and is properly positioned within the scan bits of the scan channels;
   a) generating at least one pseudorandom pattern;
   c) aligning one of the at least one pseudorandom patterns with the one scan cycle, wherein the one pseudorandom pattern comprises the at least one care bit at the at least one predetermined value and in the proper position, thereby testing the at least one logic device:
      wherein the step of determining at least one care bit, of a plurality of scan bits, in one of a plurality of scan cycles comprises the step of determining at least one future care bit in a future scan cycle;
      wherein the step of generating at least one pseudorandom pattern comprises determining a plurality of interim pseudorandom patterns that would be generated in scan cycles prior to the Future scan cycle; and
      wherein the step of aligning one of the at least one pseudorandom patterns with the one scan cycle comprises the steps of:
         i) determining if one of the plurality of interim pseudorandom patterns has the at least one future care bit properly positioned within the scan bits and at the at least one predetermined value;
         ii) if there is one interim pseudorandom pattern that has the at least one future care bit properly positioned within the scan bits and at the least one predetermined value, outputting the one interim pseudorandom pattern until and through the future cycle;
         iii) if none of the interim pseudorandom patterns have the at least one future care bit properly positioned within the scan bits and at the least one predetermined value, performing the following steps:
            A) outputting the interim pseudorandom patterns in the scan cycles prior to the future scan cycle;
            B) generating an additional pseudorandom pattern;
            C) determining if the additional pseudorandom pattern contain the at least one future care bit properly positioned within the scan bits and at the at least one predetermined value;
            D) if the additional pseudorandom pattern does not contain the at least one future care bit properly positioned within the scan bits and at the at least one predetermined value, skipping the additional pseudorandom pattern and performing steps 3) through (D) again;
            E) if the additional pseudorandom pattern does contain the at least one future care bit properly positioned within the scan bits and at the at least one predetermined value, outputting the additional pseudorandom pattern.

20. A method for testing a computer chip having a plurality of scan channels, the method comprising the steps of:
   a) determining at least one care bit, of a plurality of scan bits in the scan channels, in one of a plurality of scan cycles, wherein the at least one care bit tests at least one logic device for proper operation when the at least one care bit is at least one predetermined value, is aligned with the one scan cycle, and is properly positioned within the scan bits of the scan channels;
   b) generating at least one pseudorandom pattern;
   c) aligning one of the at least one pseudorandom patterns with the one scan cycle, wherein the one pseudorandom pattern comprises the at least one care bit at the at least one predetermined value and in the proper position, thereby testing the at least one logic device:

wherein the step of determining at least one care bit, of a plurality of scan bits, in one of a plurality of scan cycles comprises the step of determining a plurality of future care bits in a plurality of future scan cycles, each future scan cycle comprising at least one of the future care bits;

wherein the step of generating at least one pseudorandom pattern comprises the steps of determining a plurality of interim pseudorandom patterns that would be generated in scan cycles prior to a latest of the future scan cycles and modifying an input bit of a current pseudorandom pattern during a current scan cycle; and wherein the step of aligning one of the at least one pseudorandom patterns with the one scan cycle comprises the steps of:

i) determining if one of the plurality of interim pseudorandom patterns has appropriate five care bits for more than one of the future scan cycles; and ii) if there is one interim pseudorandom pattern that has the appropriate future care bits for more than one of the future scan cycles, modifying the input bit during the current scan cycle that is a predetermined number of scan cycles before one of the more than one future scan cycles and outputting the one interim pseudorandom pattern during each of the more than one future scan cycles, wherein the input bit is modified and the predetermined number of scan cycles is selected so that a future pseudorandom pattern comprises the appropriate care bits for the more than one future scan cycles.

* * * * *